(12) United States Patent
Jung et al.

(10) Patent No.: US 8,784,682 B2
(45) Date of Patent: Jul. 22, 2014

(54) THERMOSETTING COMPOSITION AND PRINTED CIRCUIT BOARD USING THE SAME

(75) Inventors: Myung-Sup Jung, Seongnam-si (KR); Jae-Jun Lee, Suwon-si (KR)

(73) Assignees: Samsung Electro-Mechanics Co., Ltd. (KR); Samsung Fine Chemicals Co., Ltd. (KR)

( * ) Notice: Subject to any disclaimer, the term of this patent is extended or adjusted under 35 U.S.C. 154(b) by 232 days.

(21) Appl. No.: 13/048,147

(22) Filed: Mar. 15, 2011

(65) Prior Publication Data
US 2011/0235292 A1 Sep. 29, 2011

(30) Foreign Application Priority Data
Mar. 29, 2010 (KR) .................. 10-2010-0028179

(51) Int. Cl.
| | | |
|---|---|---|
| C09K 19/38 | (2006.01) | |
| C09K 19/52 | (2006.01) | |
| C09K 19/30 | (2006.01) | |
| C09K 19/32 | (2006.01) | |
| C09K 19/34 | (2006.01) | |
| C09K 19/12 | (2006.01) | |
| C09K 19/20 | (2006.01) | |
| C09K 19/54 | (2006.01) | |
| H05K 1/00 | (2006.01) | |
| H05K 1/16 | (2006.01) | |

(52) U.S. Cl.
USPC .............. 252/299.01; 252/299.5; 252/299.61; 252/299.62; 252/299.63; 252/299.66; 252/299.67; 174/250; 174/256; 174/258; 361/748; 361/760

(58) Field of Classification Search
CPC .. C09K 19/22; C09K 19/3822; H05K 1/0353; H05K 2201/0141
USPC .................. 361/748, 760; 174/250, 256, 258; 252/299.01, 299.5, 299.61, 299.62, 252/299.63, 299.66
See application file for complete search history.

(56) References Cited

U.S. PATENT DOCUMENTS

| | | | |
|---|---|---|---|
| 7,582,961 B2 | 9/2009 | Chia et al. | |
| 8,512,596 B2 * | 8/2013 | Kim et al. | ................ 252/299.01 |
| 2008/0053688 A1 | 3/2008 | Park et al. | |
| 2010/0124037 A1 * | 5/2010 | Jung et al. | ..................... 361/783 |
| 2010/0139961 A1 * | 6/2010 | Kim et al. | ..................... 174/258 |
| 2011/0236701 A1 * | 9/2011 | Lee et al. | ..................... 428/458 |

FOREIGN PATENT DOCUMENTS

| | | |
|---|---|---|
| JP | 09-076417 | 3/1997 |
| JP | 2002-265729 | 9/2002 |
| JP | 2005-200542 | 7/2005 |
| KR | 1020080020936 A | 3/2008 |

* cited by examiner

Primary Examiner — Shean C Wu
(74) Attorney, Agent, or Firm — Cantor Colburn LLP

(57) ABSTRACT

Disclosed are a thermosetting composition including a liquid crystal oligomer, a bismaleimide-based compound, an epoxy compound, and a fluorinated polymer resin powder. A resin cured product, board, and storage medium each include the thermosetting composition.

24 Claims, 2 Drawing Sheets

THERMOSETTING COMPOSITION AND PRINTED CIRCUIT BOARD USING THE SAME

CROSS-REFERENCE TO RELATED APPLICATION

This application claims priority Korean Patent Application No. 10-2010-0028179, filed on Mar. 29, 2010, and all the benefits accruing therefrom under 35 U.S.C. 119, the content of which in its entirety is herein incorporated by reference.

BACKGROUND

1. Field

This disclosure relates to a thermosetting composition and a printed circuit board using the same.

2. Description of the Related Art

In developing information and communication technologies, a computer and a communicational device may be integrated to provide a highly advanced communication and information device. In addition, as electronic devices such as portable telephones, personal telephones, and the like are reduced in size while improving their performance. Printed circuit boards, which are a fundamental element of the construction of such devices, are therefore being developed to have ever higher component density by integration strategies such as multi-layering, decreasing the thickness of the board, reducing the diameter of through-holes, and decreasing the distance between through-holes, where to achieve such component density also requires development of board materials having improved performance.

Since recent electronic information devices such as computers process information within very short time frames, operation frequency has increased which in turn leads to more signal transmission difficulties such as increased transmission loss and longer delay times for signal transmission. Since the signal transmission delay in a printed circuit board is generally proportional to the square root of the relative dielectric constant of the insulation material surrounding the wiring, printed circuit boards requiring a high transmission rate must be fabricated from resin compositions having low dielectric rates. Also, such a new material for a printed circuit board should provide excellent heat resistance, impregnation characteristics, and thermosetting functions when a board is formed of a film or prepreg.

SUMMARY

One embodiment of this disclosure provides a thermosetting composition for manufacturing a board.

Another embodiment of this disclosure provides a film or prepreg using the thermosetting composition.

Yet another embodiment of this disclosure provides a printed circuit board using the thermosetting composition.

According to one embodiment, a thermosetting composition is provided that includes a liquid crystal oligomer, a bismaleimide-based compound; an epoxy compound, and a fluorinated polymer resin powder.

According to another embodiment, a prepreg, a film, or a board prepared using the thermosetting composition is provided.

The thermosetting compositions prepared according to diverse embodiments of this disclosure have excellent dielectric, impregnation, and thermal characteristics, and may be used as materials for forming next-generation boards.

DETAILED DESCRIPTION

Figure 1:
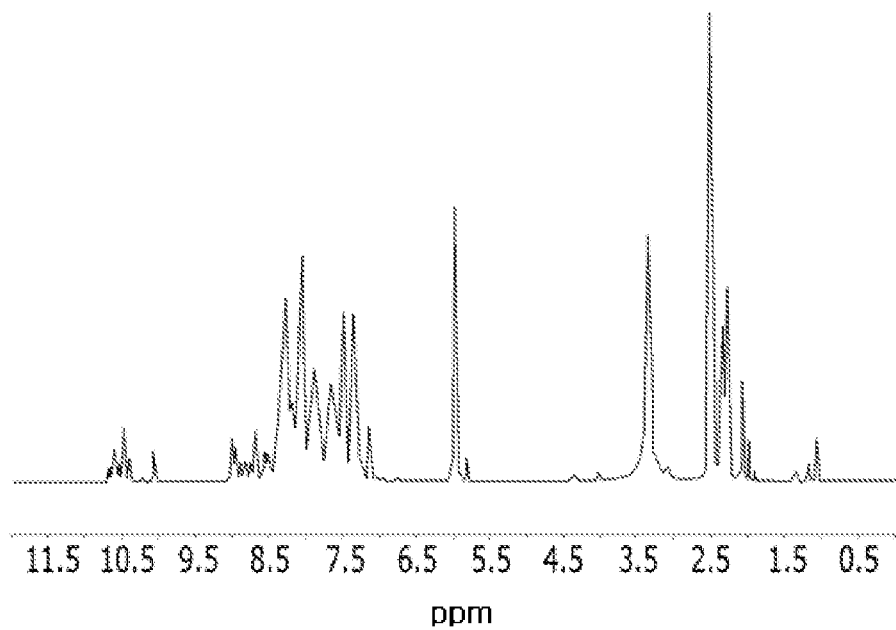
FIG. 1 shows a proton nuclear magnetic resonance ("$^1$H-NMR") spectrum of a liquid crystal oligomer synthesized according to Example 1.

Exemplary embodiments will hereinafter be described in detail. However, these embodiments are only exemplary, and this disclosure is not limited thereto.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

When a definition is not otherwise provided, the term "substituted" refers to one substituted with a halogen, a C1 to C20 alkyl group, a C1 to C20 alkoxy group, a C6 to C30 aryl group, or a C6 to C30 aryloxy group.

As used herein, "Alkyl" refers to a straight or branched chain saturated aliphatic hydrocarbon having the specified number of carbon atoms. "Alkenyl" is a straight or branched chain hydrocarbon that comprises at least one carbon-carbon double bond. "Alkoxy" refers to an alkyl moiety that is linked via an oxygen (i.e., —O-alkyl). The term "alkylene" refers to a straight, branched or cyclic divalent aliphatic hydrocarbon group. The term "alkenylene" refers to a straight, branched or cyclic divalent aliphatic hydrocarbon group containing a double bond. The term "alkynyl" refers to a straight or branched chain hydrocarbon that has one or more unsaturated carbon-carbon bonds, at least one of which is a triple bond. As used herein "aryl," means a cyclic moiety in which all ring members are carbon and at least one ring is aromatic. More than one ring may be present, and any additional rings may be independently aromatic, saturated or partially unsaturated, and may be fused, pendant, spirocyclic or a combination thereof. An "arylalkylene" group is an aryl group linked via an alkylene moiety. The specified number of carbon atoms (e.g., C7 to C20) refers to the total number of carbon atoms present in both the aryl and the alkylene moieties. Representative arylalkyl groups include, for example, benzyl groups. As used herein, "arylalkyl" refers to an alkylene group in which one of the hydrogen atoms of the alkylene is replaced by an aryl group. As used herein, the term "arylene" refers to a divalent radical formed by the removal of two hydrogen atoms from one or more rings of an aromatic hydrocarbon, wherein the hydrogen atoms may be removed from the same or different rings (preferably different rings), each of which rings may be aromatic or nonaromatic. "Aryloxy" refers to an aryl moiety that is linked via an oxygen (i.e., —O-aryl). "Cycloalkylene" refers to a divalent radical formed by the removal of two hydrogen, atoms from one or more rings of a cycloalkyl group (a nonaromatic hydrocarbon that comprises at least one ring). A "heteroalkyl" group is an alkyl group that comprises at least one heteroatom covalently bonded to one or more carbon atoms of the alkyl group. A "heteroaryl" group is a monovalent carbocyclic ring system that includes one or more aromatic rings, in which at least one ring member (e.g., one, two or three ring members) is a heteroatom. "Heteroarylene" refers to a divalent radical formed by the removal of two hydrogen atoms from one or more rings of a heteroaryl moiety, wherein the hydrogen atoms may be removed from the same or different rings (preferably the same ring), each of which rings may be aromatic or nonaromatic. As used herein, "combination" is inclusive of blends, mixtures, alloys, reaction products, and the like. A "heteroarylalkyl" group is a heteroaryl group linked via an alkylene moiety. "Cyclo" refers to a moiety having a ring structure, where multiple rings, if present, may be pendant, spiro or fused.

When a definition is not otherwise provided, the terms "alkyl group", "alkenyl group", "alkynyl group", "alkylene group", "alkenylene group", "alkynylene group", "cycloalkylene group", "cycloalkenylene group", "cycloalkynylene group", "alkoxy group", and "alkoxylene group" refer to a C1 to C20 alkyl group, a C2 to C20 alkenyl group, a C2 to C20 alkynyl group, a C2 to C20 alkylene group, a C2 to C20 alkenylene group, a C2 to C20 alkynylene group, a C3 to C20 cycloalkylene group, a C3 to C20 cycloalkenylene group, a C3 to C20 cycloalkynylene group, a C1 to C20 alkoxy group, and a C2 to C20 alkoxylene group, respectively, and "aryl group", "arylene group", "aryloxy group", and "aryleneoxy group" refer to a C6 to C30 aryl group, a C6 to C30 arylene group, a C6 to C30 aryloxy group, and a C6 to C30 aryleneoxy group, respectively.

When a definition is not otherwise provided, the terms "heteroarylene group" and "heteroaryleneoxy group" refer to a heteroarylene and a heteroarylenearyleneoxy including a heteroatom of N, O, S, or P in an arylene ring. The terms "heterocycloalkylene group", "heterocycloalkenylene group", and "heterocycloalkynylene group" refer to a heterocycloalkylene group, a heterocycloalkenylene group, and a heterocycloalkynylene group including at least one heteroatom of a N, O, S, or P heterocycloalkylene group, heterocycloalkenylene group, and heterocycloalkynylene group.

The diverse embodiments of this disclosure are directed to a next-generation printed circuit board and a material for the same.

A conventional printed circuit board such as a prepreg using a fluorine-based polymer resin has a low dielectric characteristic, but it may not be generally used due to low dimensional stability. A prepreg using polytetrafluoroethylene ("PTFE") is prepared by impregnating a reinforcing material such as glass fiber with an impregnation solution of PTFE powder is dispersed in a solvent such as water, and drying the impregnation solution. Since PTFE has low solubility in the solvent, the PTFE hardly permeates the glass fiber. Such poor impregnation characteristic may lead to deterioration in reliability when a copper foil circuit is processed to fabricate a printed circuit board. When the printed circuit board contacts a developing solution and an etching solution, a capillary tube effect may occur and water or an organic solvent may permeate any empty space inside the glass fiber. Therefore, it is difficult to apply a prepreg which uses PTFE to a printed circuit board.

Also, since a conventional printed circuit board such as a prepreg using a fluorinated polymer resin is thermoplastic, the polymer resin may melt and flow or may deform during repeated laminating processes encountered during manufacture of a printed circuit board.

Embodiments of this disclosure are thus directed to a thermosetting composition having excellent heat resistance, impregnation characteristics, and thermosetting functions as well as low dielectric characteristics, and to a printed circuit board using the thermosetting composition.

The thermosetting composition according to one embodiment includes a liquid crystal oligomer, a bismaleimide-based compound, an epoxy compound, and a fluorine-based polymer resin powder. Hereinafter, each component is described in detail.

Liquid Crystal Oligomer

The liquid crystal oligomer includes an aromatic or aliphatic ring structural unit having a "kink" structure and a mesogen structural unit in its backbone. For example, the liquid crystal oligomer includes a backbone represented by the following Chemical Formula 1. As used herein, an asterisk ("*") included at a bond terminus in a Chemical Formula indicates a point of attachment to another bond terminus.

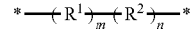

Chemical Formula 1

In Chemical Formula 1, $R^1$ is an aromatic or aliphatic ring structural unit having a kink structure, $R^2$ is a mesogen structural unit, and n and m are independently integers of from 1 to 100.

The aromatic or aliphatic ring structural unit having a kink structure may be an aromatic or aliphatic cyclic group with two linking groups. The two linking groups may be located ortho or meta to each other where the ring is a 6-membered aromatic (e.g., benzene) ring. An aromatic or aliphatic ring structural unit having a kink structure may be iteratively introduced into the backbone of the liquid crystal oligomer. The introduction of the kink structure reduces the linearity of the backbone of a liquid crystal oligomer, and the reduced linearity of the liquid crystal oligomer having a kink structure may decrease the interaction and crystallinity between oligomer backbones and improve solubility in a solvent. Therefore, the impregnation characteristics of a composition including a liquid crystal oligomer is facilitated relative to an oligomer with an unkinked structure, and therefore when the composition is applied to a printed circuit board, improved dimensional stability may be achieved.

The aromatic or aliphatic ring structural unit having a kink structure may be represented by the following Chemical Formula 2.

Chemical Formula 2

In Chemical Formula 2, $X^1$ and $Y^1$ are independently O, NR", or C(=O), where R" is hydrogen, a substituted or unsubstituted C1 to C20 alkyl group, or a substituted or unsubstituted C6 to C30 aryl group, or a combination comprising at least one of the foregoing, and $Ar^1$ includes a divalent aromatic organic group or aliphatic cyclic group represented by the following Chemical Formula 3 (where the aromatic or aliphatic cyclic group of the following Chemical Formula 3 includes or does not include at least one heteroatom of N, O, S, or P in the cycle group, or at least one hydrogen in the cycle group is substituted or unsubstituted).

An example of the aromatic or aliphatic ring structural unit having a kink structure may include any of those of the group of compounds represented by Chemical Formula 4.

Chemical Formula 3

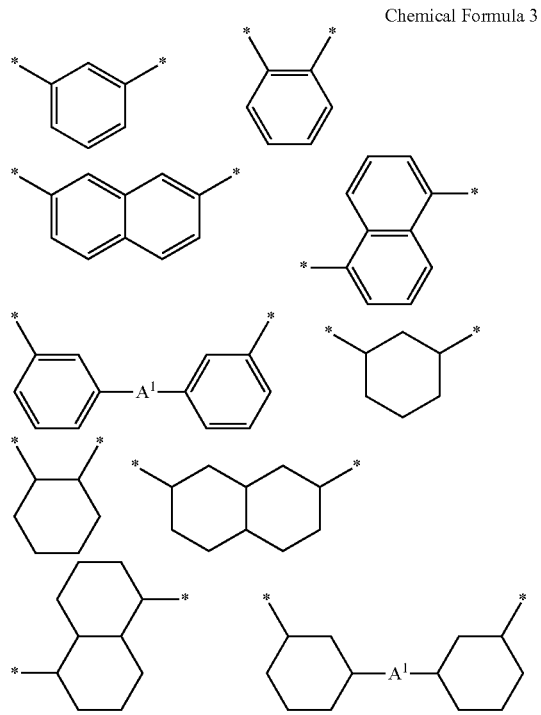

In Chemical Formula 3, $A^1$ is a single bond, divalent heteroatom group, divalent aliphatic organic group, aromatic organic group, or a combination comprising at least one of the foregoing. The divalent heteroatom group, aliphatic organic group or aromatic organic group is O, S, C(=O), S(=O), $SO_2$, a substituted or unsubstituted C2 to C20 alkylene group, a substituted or unsubstituted C2 to C20 alkoxylene group, a substituted or unsubstituted C2 to C20 alkoxyleneoxy group, a substituted or unsubstituted C6 to C30 arylene group, a substituted or unsubstituted C6 to C30 aryleneoxy group, a substituted or unsubstituted C6 to C30 heteroarylene group, a substituted or unsubstituted C6 to C30 heteroaryleneoxy group, a linker represented by the following Chemical Formula 3a, a linker represented by the following Chemical Formula 3b, or a combination comprising at least one of the foregoing.

Chemical Formula 3a

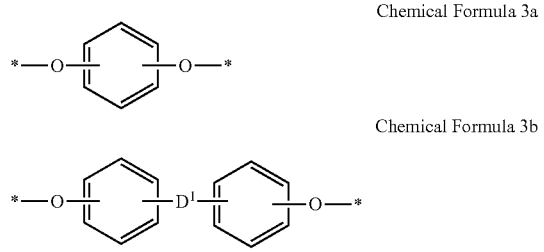

Chemical Formula 3b

In Chemical Formula 3b, $D^1$ is O, S, C(=O), S(=O), $SO_2$, a linear or branched C1 to C20 alkylene group or a combination comprising at least one of the foregoing.

Chemical Formula 4

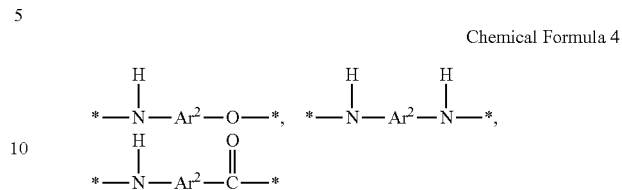

In Chemical Formula 4, $Ar^2$ is one of linkers represented by the following Chemical Formula 5.

Chemical Formula 5

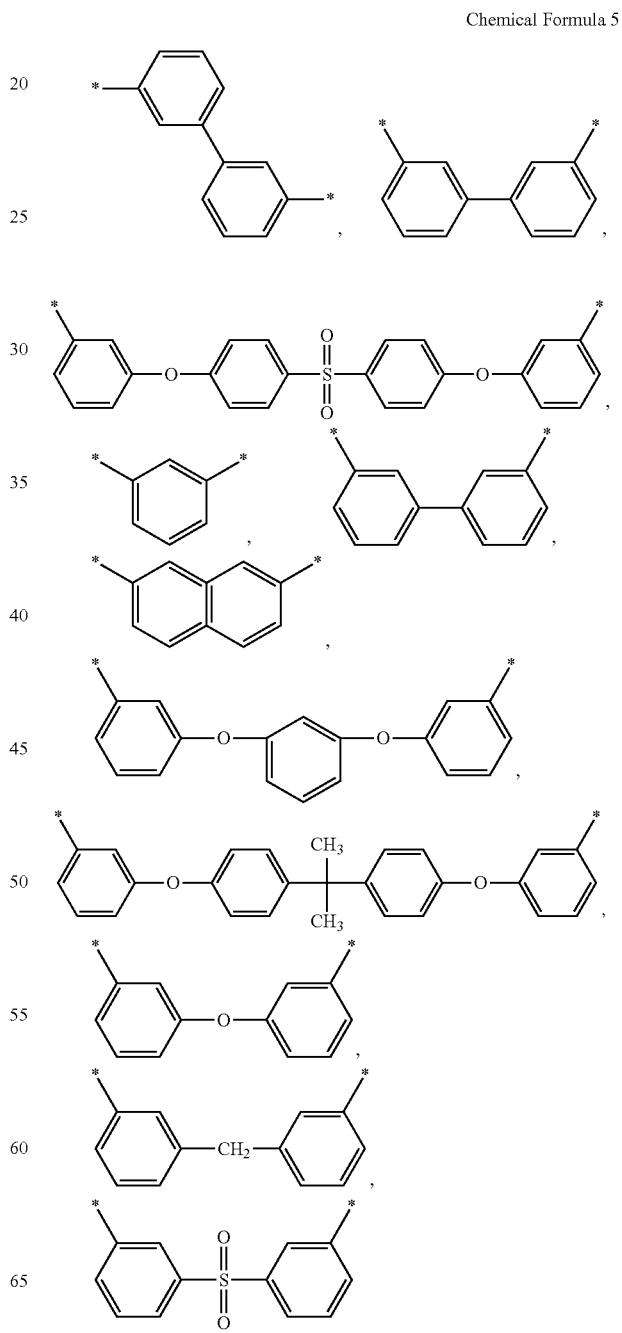

The mesogen structural unit may be represented by Chemical Formula 6.

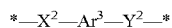  Chemical Formula 6

In Chemical Formula 6, $X^2$ and $Y^2$ are independently O, NR", or C(=O), where R" is hydrogen, a substituted or unsubstituted C1 to C20 alkyl group, a substituted or unsubstituted C6 to C30 aryl group, or a combination comprising at least one of the foregoing, and $Ar^3$ includes at least one of divalent aromatic organic groups represented by the following Chemical Formula 7, or an aliphatic cyclic group (where the aromatic or aliphatic cyclic group of the following Chemical Formula 7 includes or does not include at least one heteroatom of N, O, S, or P in the cycle group, or at least one hydrogen in the cycle group is substituted or unsubstituted).

Chemical Formula 7

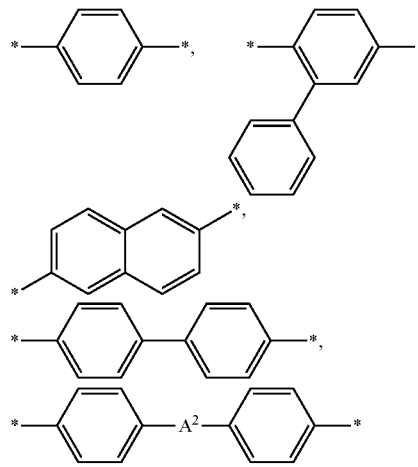

In Chemical Formula 7, $A^2$ is a divalent heteroatom group, aliphatic organic group or an aromatic organic group, or a combination comprising at least one of the foregoing.

In Chemical Formula 7, $A^2$ is $N_2$, O, S, C(=O), S(=O), $SO_2$, a substituted or unsubstituted C2 to C20 alkylene group, a substituted or unsubstituted C2 to C20 alkenylene group, a substituted or unsubstituted C2 to C20 alkoxylene group, a substituted or unsubstituted C2 to C20 alkoxyleneoxy group, a substituted or unsubstituted C6 to C30 arylene group, a substituted or unsubstituted C6 to C30 aryleneoxy group, a substituted or unsubstituted C6 to C30 heteroarylene group, a substituted or unsubstituted C6 to C30 heteroaryleneoxy group, a linker represented by Chemical Formulae 8a and 8b, or a combination comprising at least one of the foregoing. In the following Chemical Formulae 8a and 8b, $R_a$ and $R_b$ are independently hydrogen, a halogen, a C1 to C5 alkyl group, a C1 to C5 haloalkyl group, or a combination comprising at least one of the foregoing.

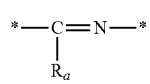  Chemical Formula 8a

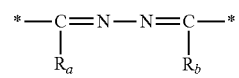  Chemical Formula 8b

An example of a mesogen structural unit includes those of the group of groups represented by the following Chemical Formula 9.

Chemical Formula 9

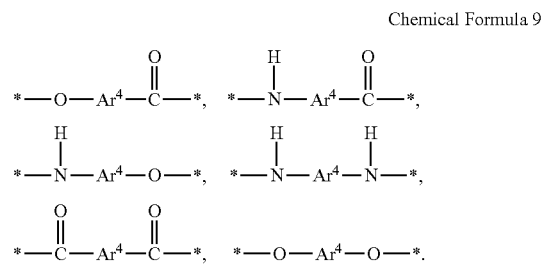

In Chemical Formula 9, $Ar^4$ may be selected from the group of linkers represented by the following Chemical Formula 10. Combinations comprising at least one of these linkers may be used.

Chemical Formula 10

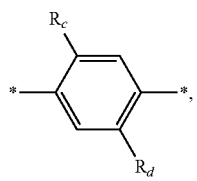
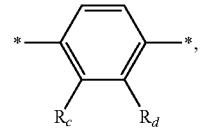
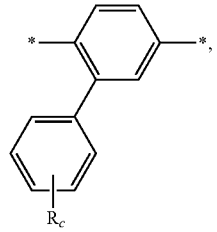
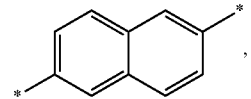

-continued

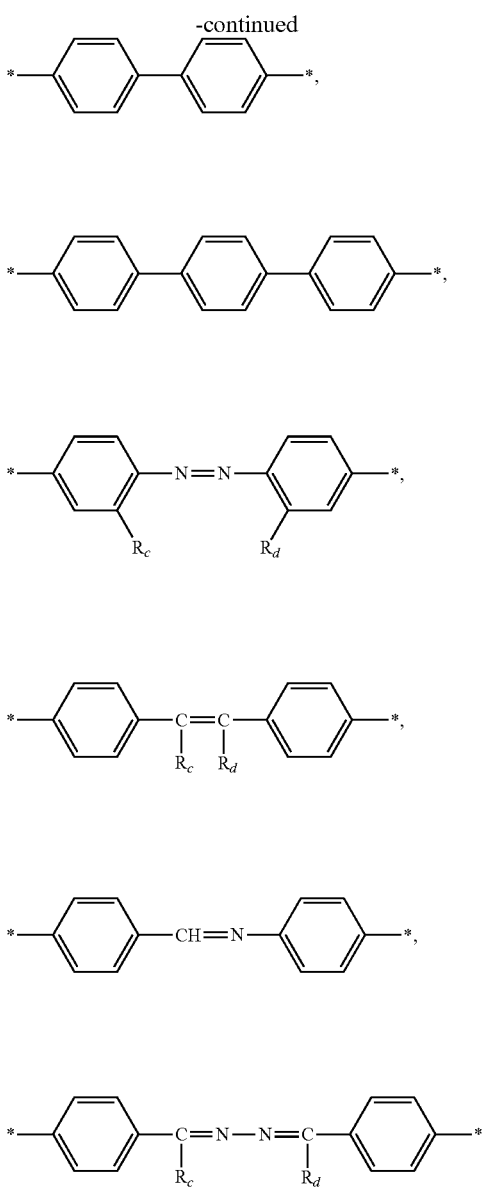

In Chemical Formula 10, $R_c$ and $R_d$ are independently hydrogen, a C1 to C5 alkyl group, a halogen, or a combination comprising at least one of the foregoing.

The liquid crystal oligomer may include an aromatic or aliphatic ring structural unit having a kink structure in a content of from greater than about 5 mol % to about 60 mol % based on the total amount of the entire structural units. In Chemical Formula 1, m/(n+m+2) is greater than about 0.05, and less than or equal to about 0.6.

The aromatic or aliphatic ring structural unit having a kink structure may be introduced to a backbone by using an aromatic ring compound or aliphatic cyclic compound with two functional groups at, for example, the ortho or meta positions of a 6-membered aromatic ring or at the 1,2- or 1,3-positions in a cycle, when a liquid crystal oligomer is prepared. Also, the content of the aromatic or aliphatic ring structural unit having a kink structure may be controlled by the content of a corresponding monomer added thereto. The solubility and liquid crystal characteristics of the liquid crystal oligomer may be controlled by changing the type and content of the aromatic or aliphatic ring structural unit having a kink structure. The liquid crystal oligomer represented by the above Chemical Formula 1 may be an oligomer having a structural unit $R^1$ and a structural unit $R^2$ arranged at random, in blocks or alternately. For example, the backbone of an oligomer having two monomeric units $R^1$ and $R^2$ may be arranged in a block structure such as —$R^1R^1R^1 \ldots R^2R^2R^2$—, or arranged in random patterns such as —$R^1R^1R^2 \ldots R^1R^2R^2$— or —$R^1R^2R^2R^2 \ldots R^1R^2$—, or arranged in an alternating structure —$R^1R^2R^1R^2 \ldots R^1R^2$—. These arrangements are in no way intended to be limiting, but merely are illustrative of the arrangement of monomers in a two-monomer oligomer. It will be recognized that analogous arrangements of monomers may be made where three, four, five, etc. monomer units are included.

The liquid crystal oligomer may include a hydroxy group, an amine group, a carboxyl group, an acetyl group, or a thiol group at each terminal end, and at least one of the terminal ends includes an organic group including a hydroxy group. With the hydroxy group at the terminal end, the solubility for a solvent may be excellently improved. Therefore, the composition has improved solubility and thus it has excellent impregnation characteristics, and may be used as a high solids (>30 wt %) varnish.

Examples of the liquid crystal oligomer with a hydroxy group at the terminal end of the above Chemical Formula 1 include those of the following Chemical Formula 11a, 11b, 11c or 11d; however this disclosure is not limited thereto.

   Chemical Formula 11a

   Chemical Formula 11b

   Chemical Formula 11c

   Chemical Formula 11d

In Chemical Formulae 11a to 11d, $R^1$ is a structural unit represented by the above Chemical Formula 2, $R^2$ is a structural unit represented by the above Chemical Formula 6, and, m and n are integers of from 1 to 100. m/(n+m+2) is greater than about 0.05, and less than or equal to about 0.6.

An example of the liquid crystal oligomer with a hydroxy group introduced at a terminal end may include an oligomer represented by the following Chemical Formula 12.

Chemical Formula 12

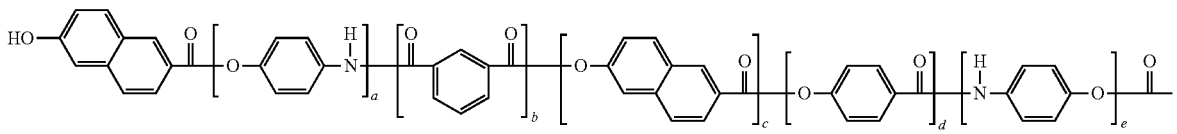

In the above Chemical Formula 12, a, b, c, d, and e are independently integers of from 0 to 100, and 1≤a+c+d+e≤100 or 1≤b≤100.

Examples of the liquid crystal oligomer with a hydroxy group introduced at a terminal end of the above Chemical Formula 1 may include a compound represented by the following Chemical Formula 13a-13e, 14a-14e, 15a-15e, 16a-16e, or 17a-17e, where the present invention is not limited thereto.

Chemical Formula 13a

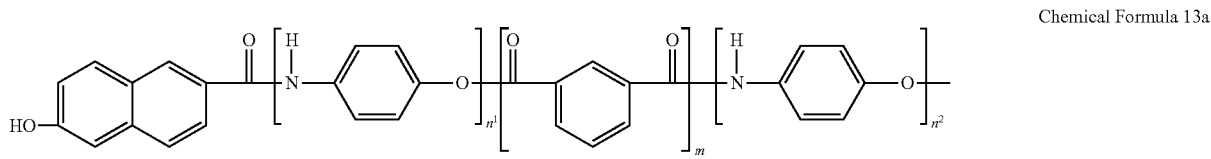

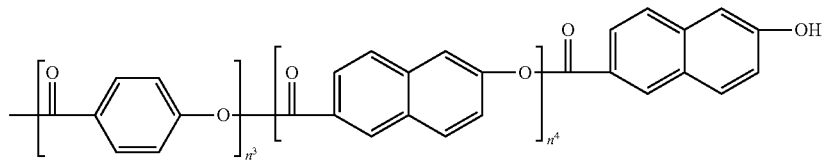

Chemical Formula 13b

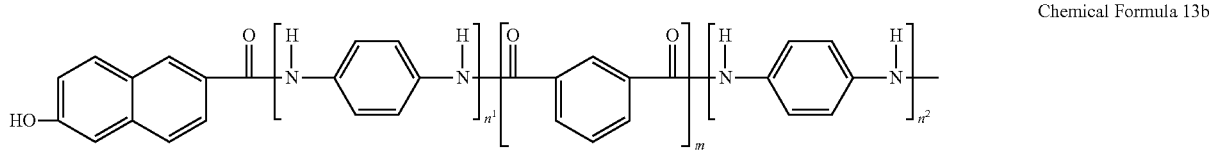

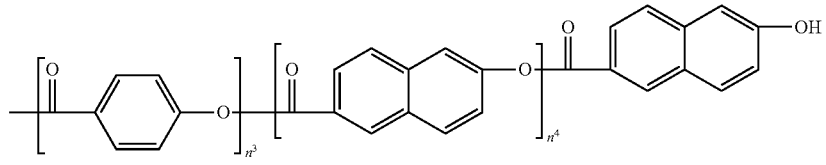

Chemical Formula 13c

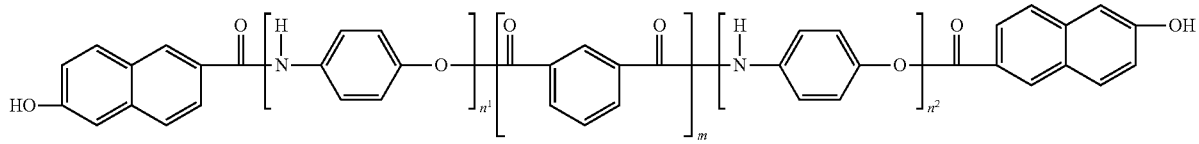

Chemical Formula 13d

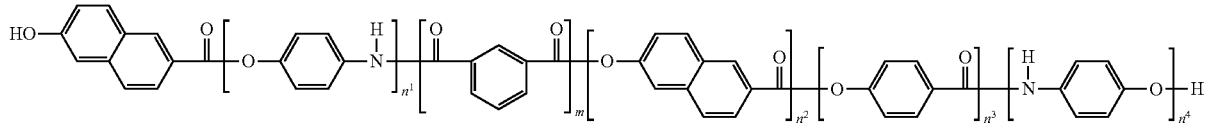

Chemical Formula 13e

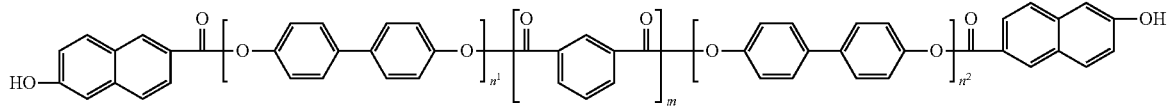

Chemical Formula 14a

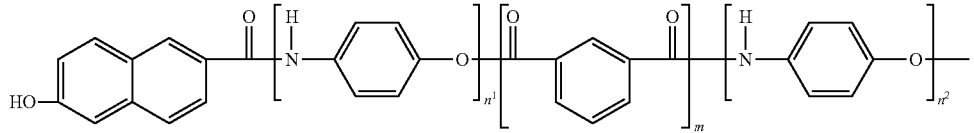

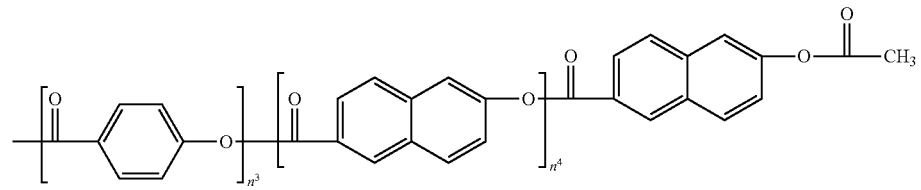

Chemical Formula 14b
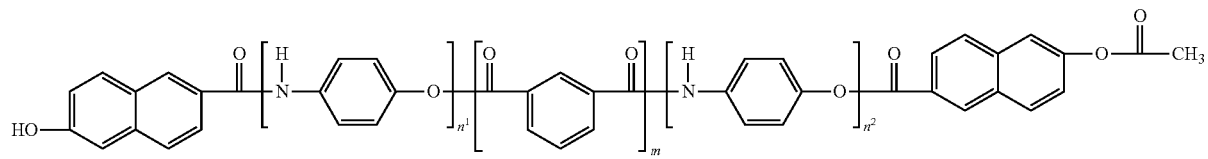
Chemical Formula 14c
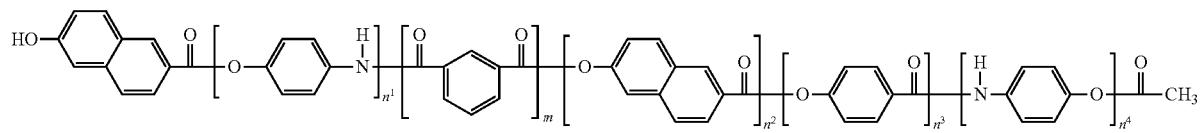
Chemical Formula 14d
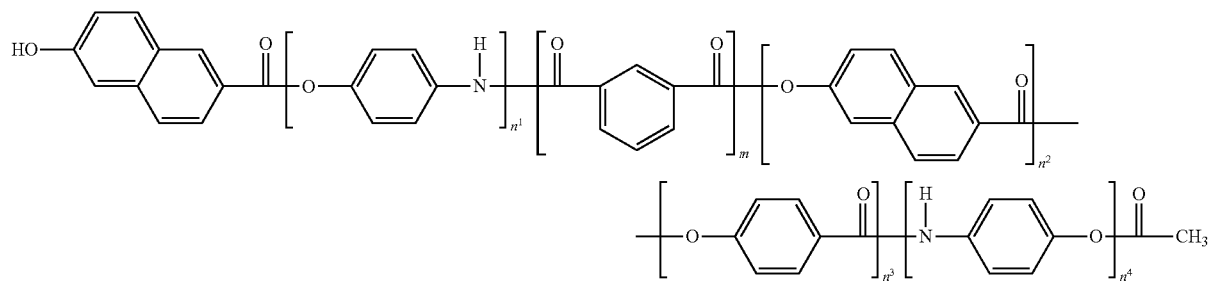
Chemical Formula 14e
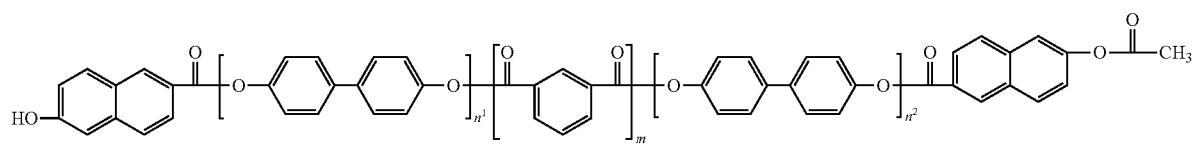
Chemical Formula 15a
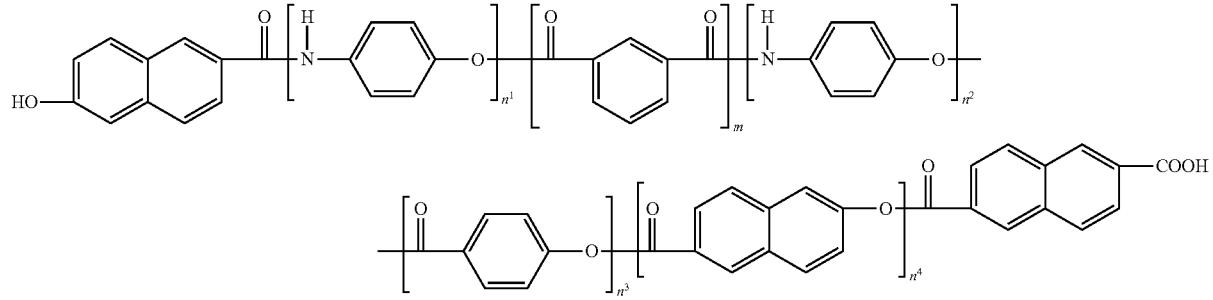
Chemical Formula 15b
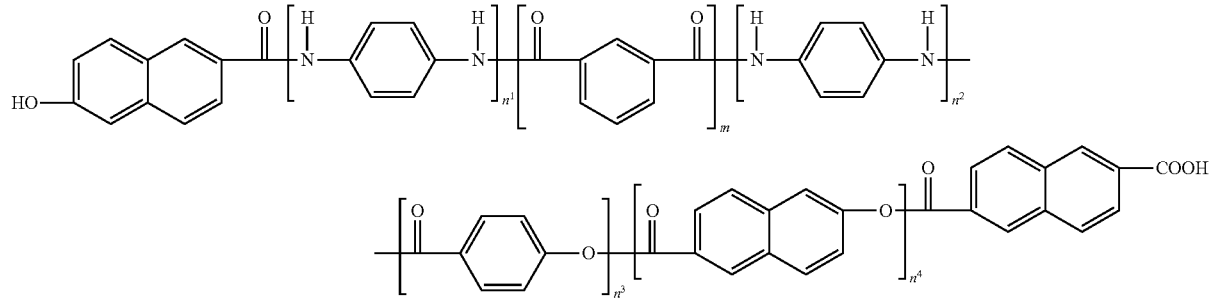
Chemical Formula 15c
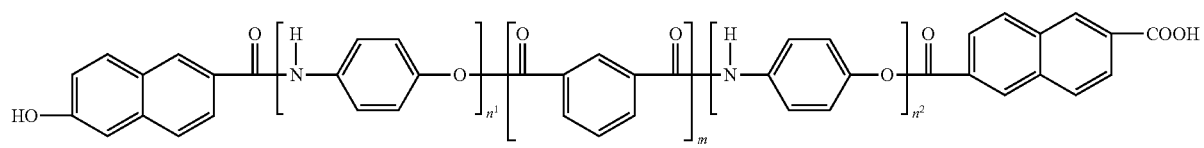

-continued
Chemical Formula 15d
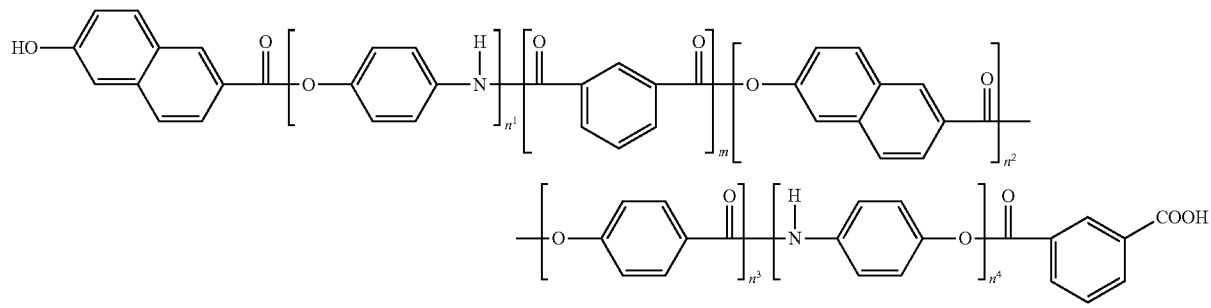
Chemical Formula 15e
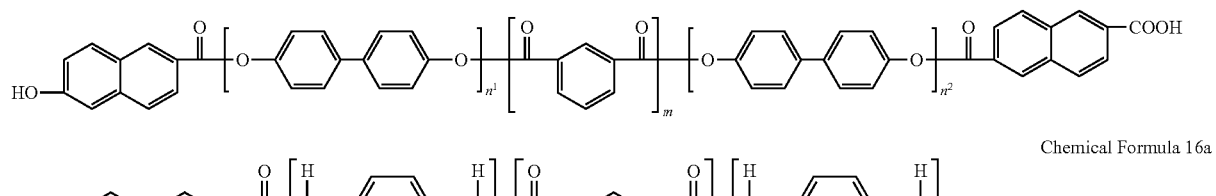
Chemical Formula 16a
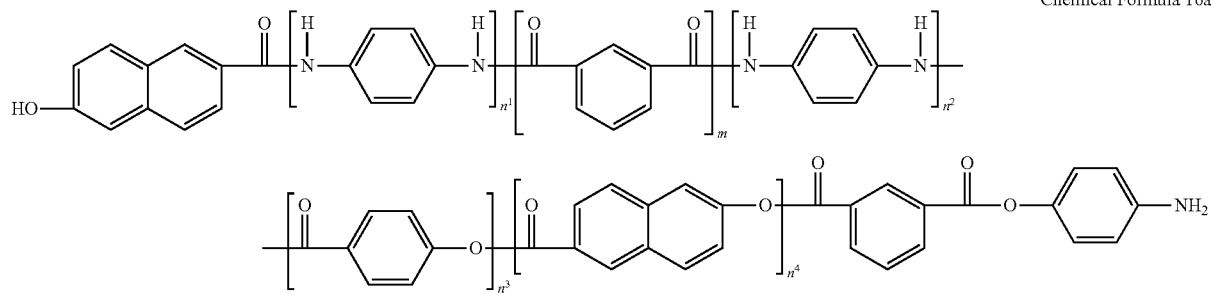
Chemical Formula 16b
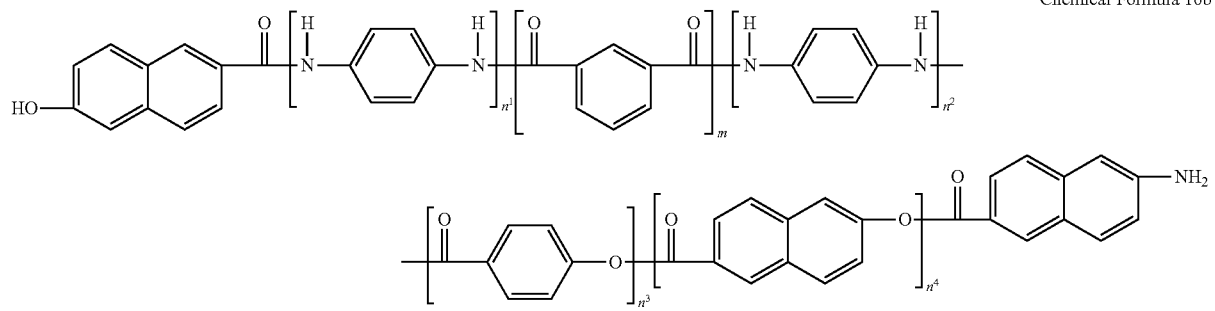
Chemical Formula 16c
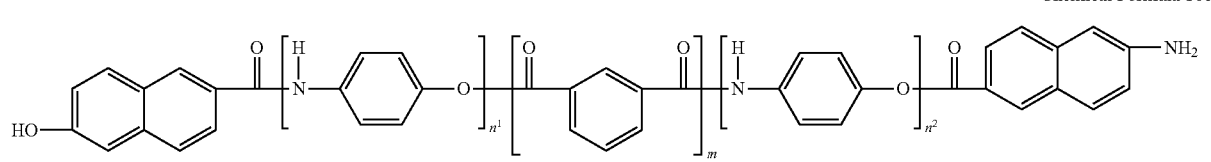
Chemical Formula 16d
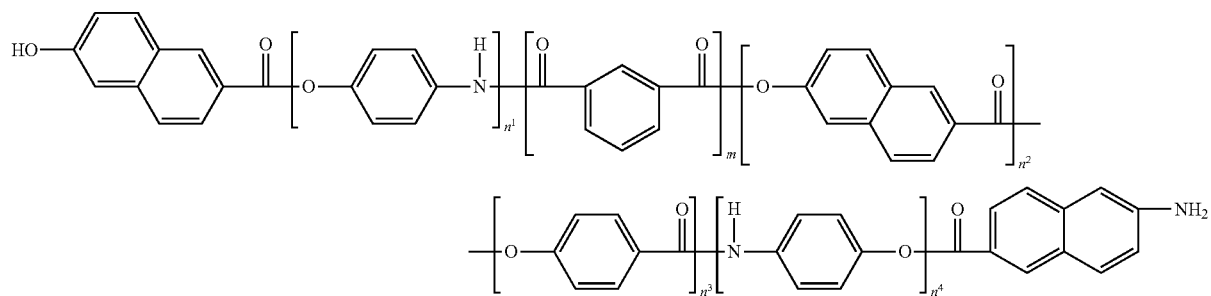

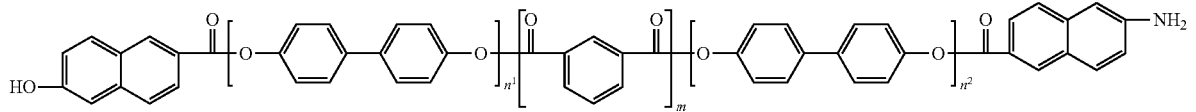

Chemical Formula 16e

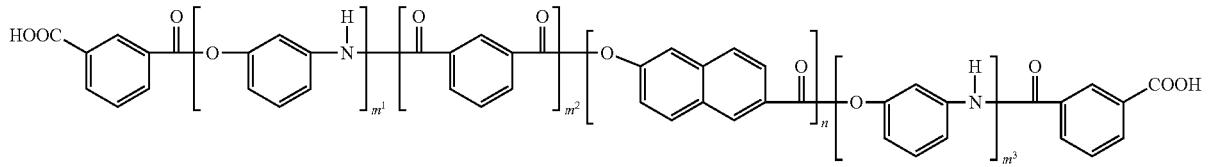

Chemical Formula 17a

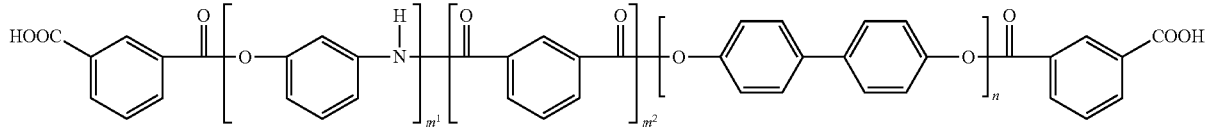

Chemical Formula 17b

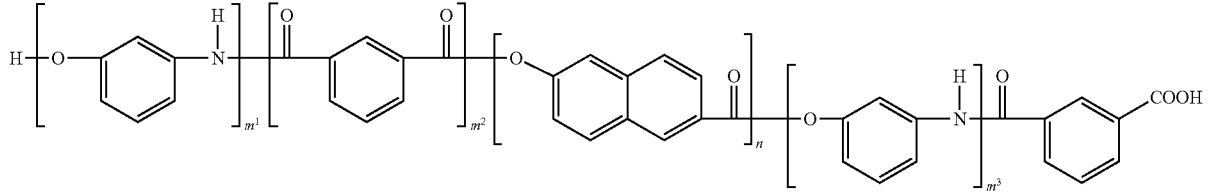

Chemical Formula 17c

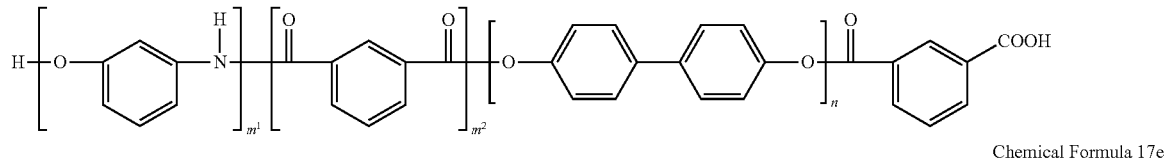

Chemical Formula 17d

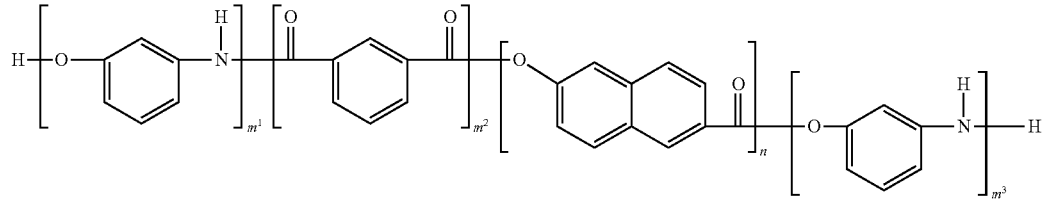

Chemical Formula 17e

In Chemical Formulae 13a-13e, 14a-14e, 15a-15e, 16a-16e, and 17a-17e, m, n, $m^1$, $m^2$, $m^3$, $n^1$, $n^2$, $n^3$, and $n^4$ are integers of from 1 to 100, where in Chemical Formulae 13a, 13b, 13d, 14a, 14b, 14d, 15a, 15b, 15d, 16a, 16b, and 16d, $1 \leq n^1 + n^2 + n^3 + n^4 \leq 100$, in Chemical Formulae 13c, 13e, 14c, 14e, 15c, 15e, 16c, and 16e, $1 \leq n^1 + n^2 \leq 100$, in Chemical Formulae 17a, 17c, and 17e, $1 \leq m^1 + m^2 + m^3 \leq 100$, and in Chemical Formulae 17b and 17d, $1 \leq m^1 + m^2 \leq 100$.

A preparation method for a liquid crystal oligomer with a hydroxy group is not limited to a specific preparation method. For example, a soluble liquid crystal amide-ester oligomer with an alcohol (hydroxy) terminal end may be prepared by combining isophthalic acid, 6-hydroxy-2-naphtoic acid, 4-hydroxy-benzoic acid, 4-aminophenol, and acetic anhydride into a reactor equipped with a condenser and a mechanical stirrer, gradually increasing the temperature to 140° C. under a nitrogen atmosphere and thereby completing an acetylation reaction while maintaining the temperature for 3 hours, subsequently adding 6-hydroxy-2-naphtoic acid thereto, and increasing the temperature to 270° C. to induce a reaction for 30 minutes while removing acetic acid and unreacted acetic anhydride, which are by-products.

Both terminal ends and/or functionalizable side chains of the liquid crystal oligomer may include thermosetting functional groups. The liquid crystal oligomer may include maleimide, nadimide, citraconimide, tetrahydrophthalimide, acetylene, propargyl ether, benzocyclobutene, cyanate, a substituent thereof, a derivative thereof, or a combination comprising at least one of the foregoing at each terminal end or a side chain, independently. The thermosetting functional group forms a liquid crystal alignment structure, which is a stable network form, as a cross-linking reaction occurs between functional groups, while being cured through heat treatment. Therefore, the mechanical properties of a printed circuit board formed using the thermosetting functional group may be improved.

For example, the liquid crystal oligomer may include one selected from the compounds represented by Chemical Formulae 18a to 18k.
Chemical Formula 18a
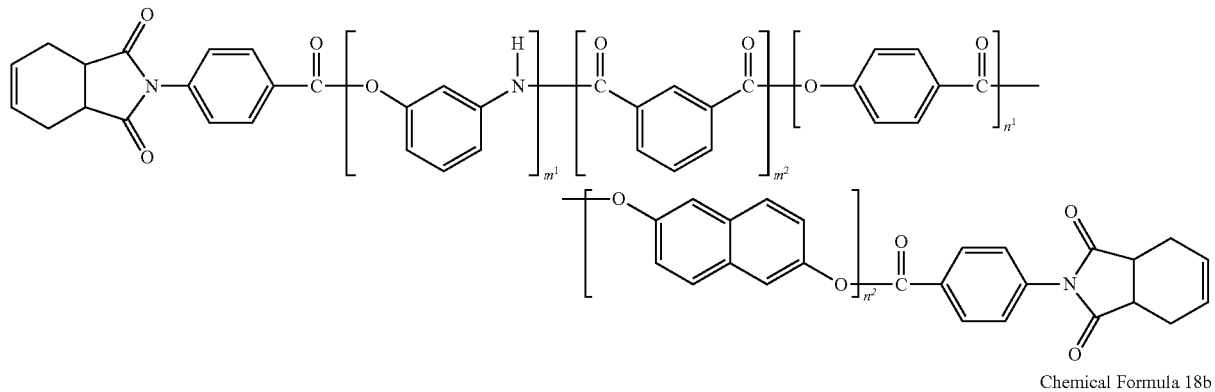
Chemical Formula 18b
Chemical Formula 18c
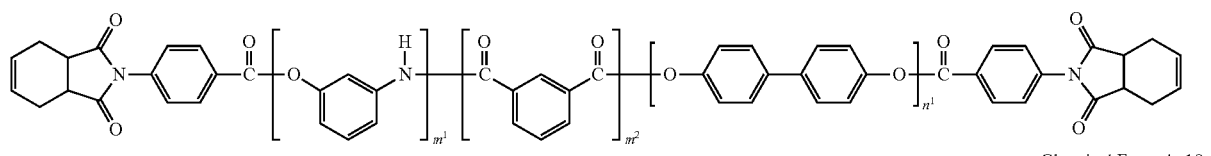
Chemical Formula 18d
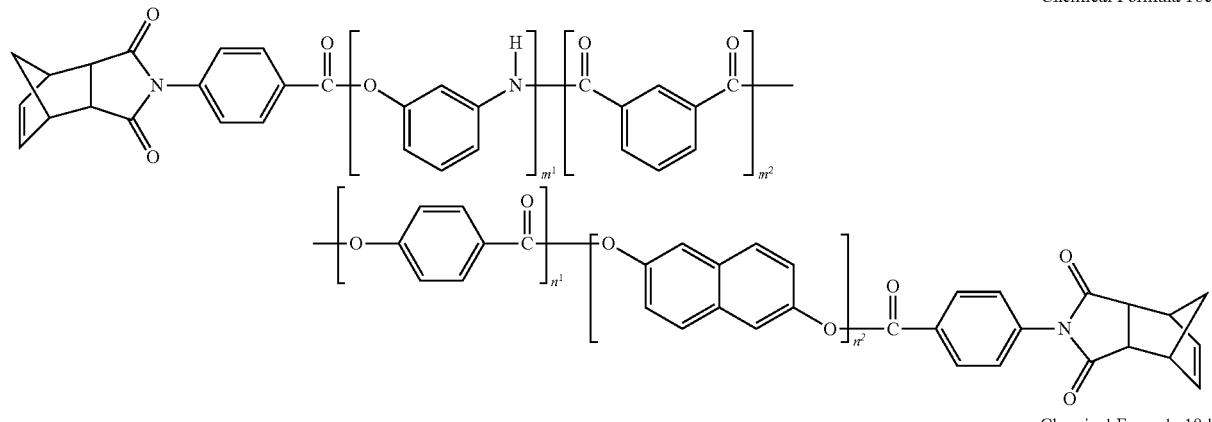
Chemical Formula 18e
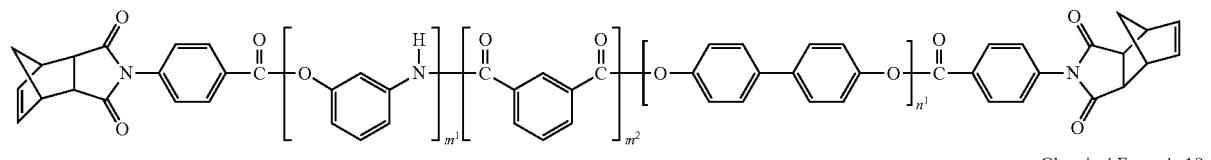
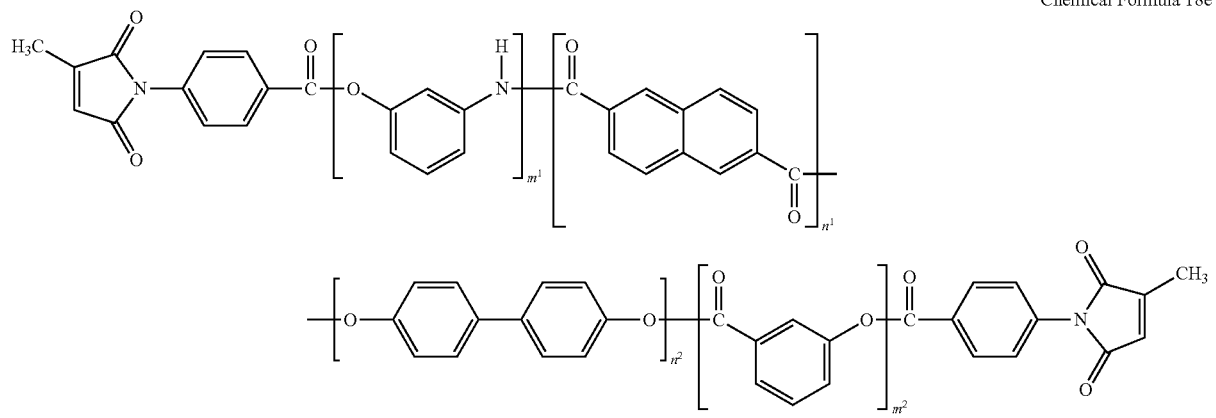

-continued
Chemical Formula 18f
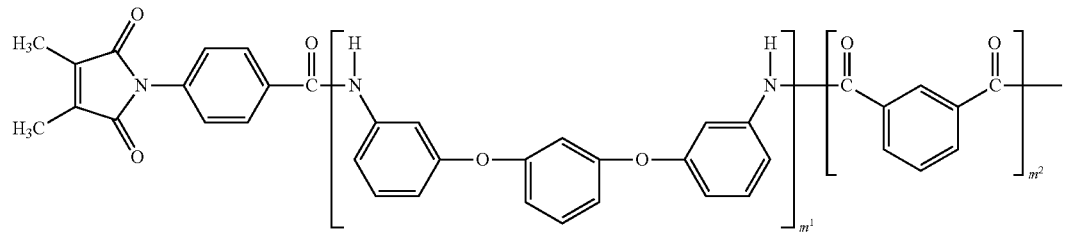
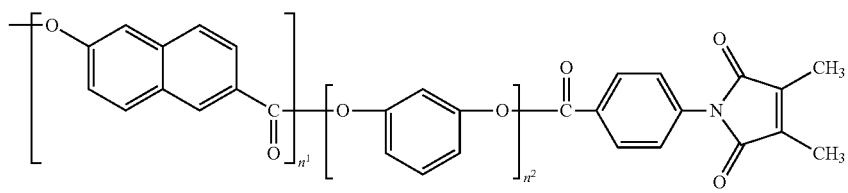
Chemical Formula 18g
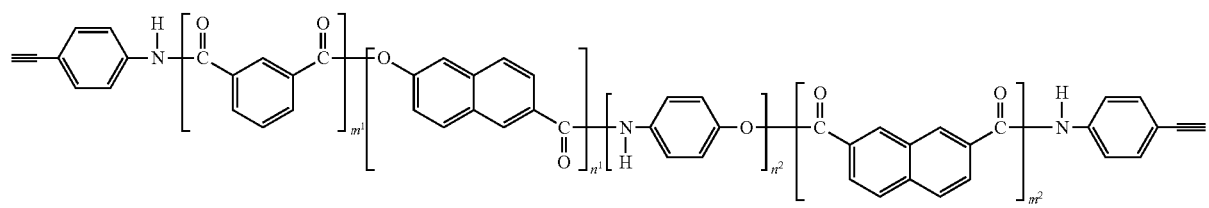
Chemical Formula 18h
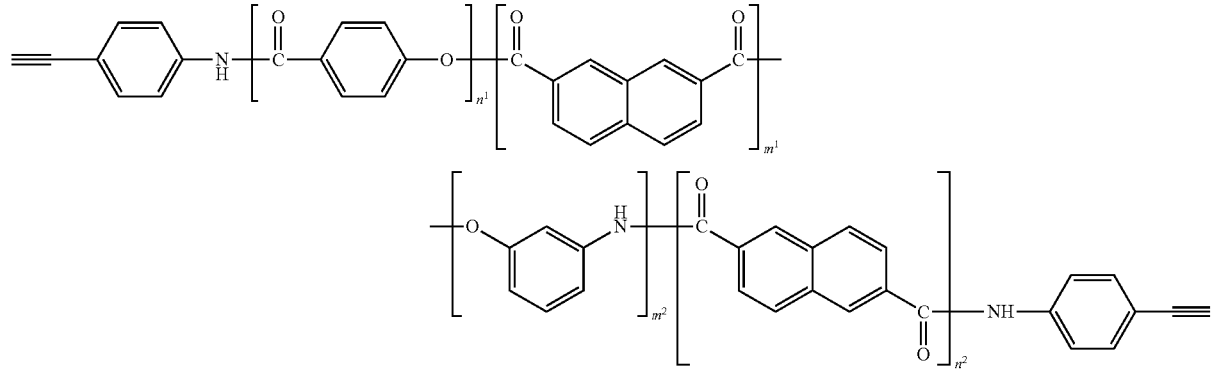
Chemical Formula 18i
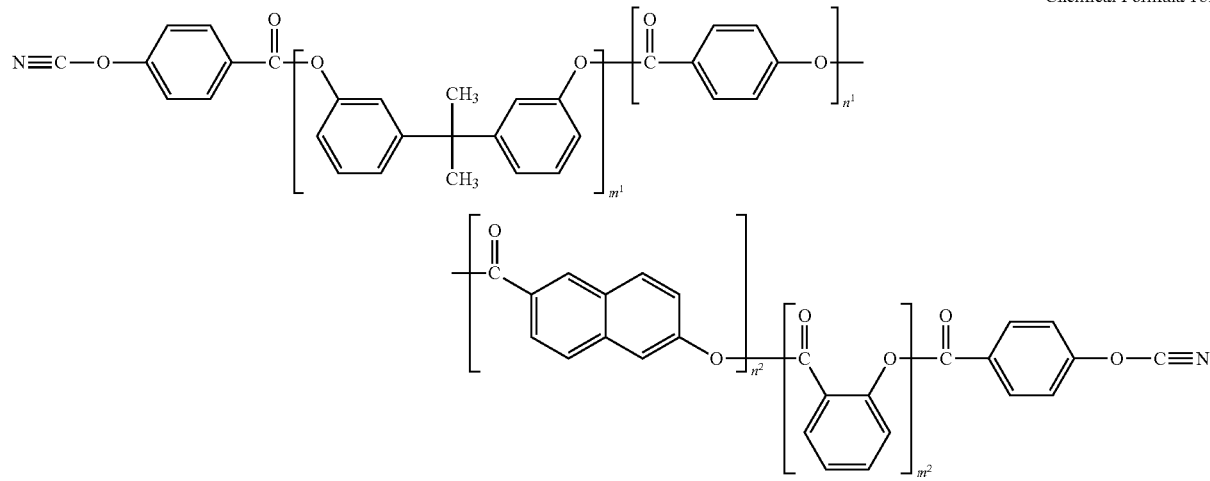

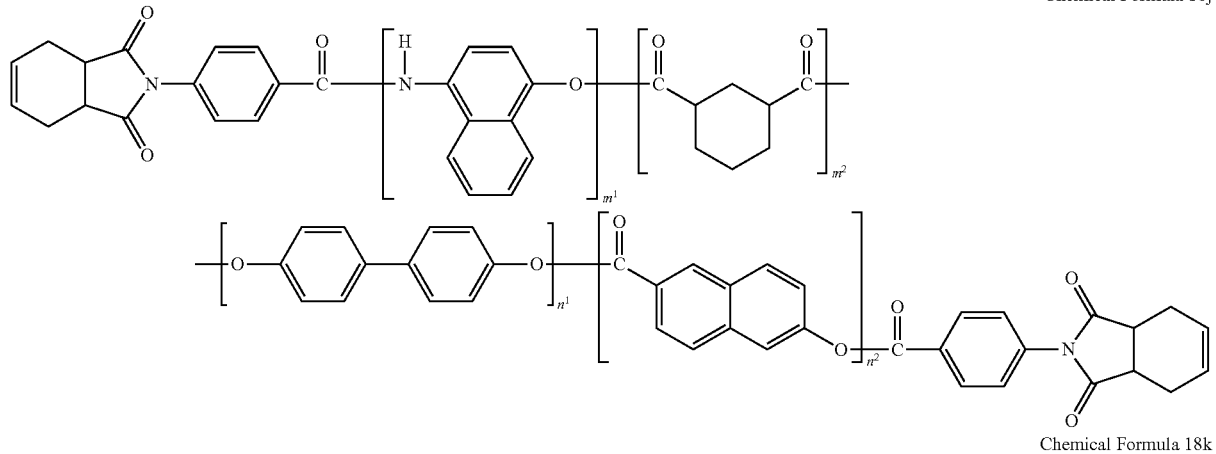

Chemical Formula 18j

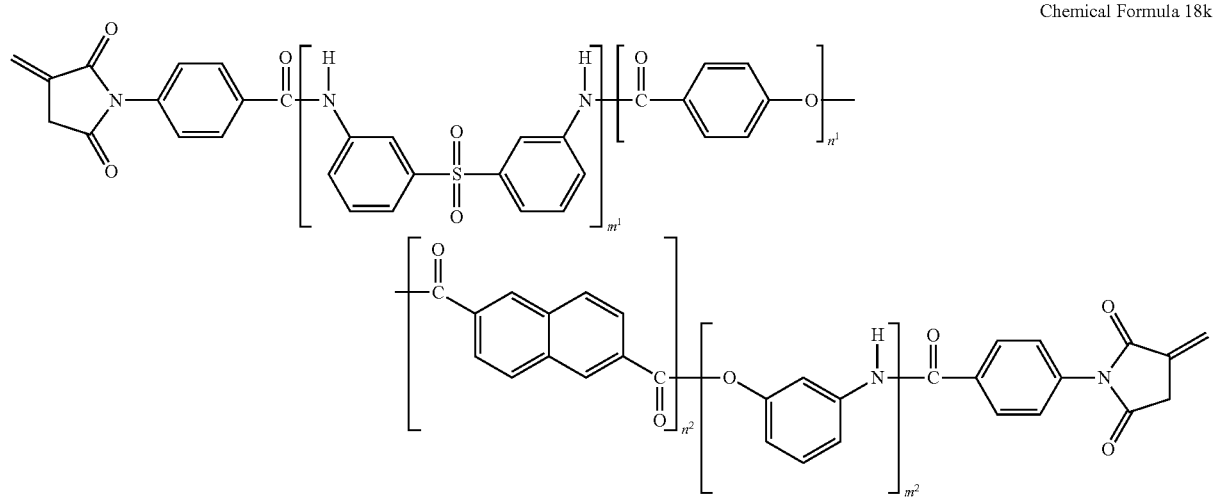

Chemical Formula 18k

In Chemical Formulae 18a to 18k, $m^1$, $m^2$, $n^1$, and $n^2$ are independently positive integers, and for example, are independently integers of from 1 to 50.

In Chemical Formulae 18a to 18k, $m^1$, $m^2$, $n^1$, and $n^2$ are integers of from 1 to 100, $1 \leq m^1+m^2 \leq 100$, and in Chemical Formulae 18a, 18c, 18e, 18f, 18g, 18h, 18i, 18j, and 18k, $1 \leq n^1+n^2 \leq 100$. In Chemical Formulae 18a, 18c, 18e, 18f, 18g, 18h, 18i, 18j, and 18k, $(m^1+m^2)/(n^1+n^2+m^1+m^2)$ of from 0.05 to 0.6, and in Chemical Formulae 18b and 18d, $(m^1+m^2)/(n^1+m^1+m^2)$ of from 0.05 to 0.6.

According to one embodiment, the liquid crystal oligomer may be of two kinds. For example, a first liquid crystal oligomer having a hydroxy group at a terminal end and a second liquid crystal oligomer having a thermosetting functional group at a terminal end or a side chain may be simultaneously used (i.e, used in combination). Herein, the first liquid crystal oligomer and the second liquid crystal oligomer may be used at a weight ratio of about 1:9 to 9:1. According to one embodiment, the first liquid crystal oligomer and the second liquid crystal oligomer may be used at a weight ratio of about 3:7 to about 7:3. According to another embodiment of this disclosure, the first liquid crystal oligomer and the second liquid crystal oligomer may be used at a weight ratio of about 1:1.

The liquid crystal oligomer has a number averaged molecular weight (Mn) ranging from about 500 to about 9,000 g/mol, and in one embodiment, about 1,000 to about 9,000 g/mol. Molecular weight (Mn) may be determined by, for example, gel permeation chromatography using a crosslinked styrene-divinyl benzene column and calibrated by universal calibration to polystyrene standards. When the thermosetting liquid crystal oligomer has an Mn of less than about 500, the cross-linking density is increased and the composition becomes brittle after cure. en the liquid crystal oligomer has an Mn exceeding about 9,000, the viscosity of the solution is increased and workability properties such as flow, permeability, and viscosity, may be significantly adversely affected.

In each structural unit constituting the thermosetting liquid crystal oligomer, an aromatic ring in the monomeric structural units may be further substituted to include an amide group, an ester group, a carboxyl group, an alkoxy group, an aryl group, a fluoromethyl group, or a combination comprising at least one of the foregoing.

Bismaleimide-Based Compound

Bismaleimide-based compounds, when included with the liquid crystal oligomer in the composition, may improve the mechanical properties of a printed circuit board prepared therefrom by forming a chemical bond with a terminal end of a liquid crystal oligomer, for example, a hydroxy group or a thermosetting functional group, and thereby forming a cross-linking network when the composition is cured.

Also, the viscosity of the composition may be controlled by mixing the liquid crystal oligomer and the bismaleimide-based compound. According to one embodiment, the composition may have viscosity as low as about 1,000 centipoise ("cps") to about 15,000 cps when the amount of solids accounts for about 50 wt %. Since a composition having high amount of solids and low viscosity has a high impregnation rate into a reinforcing material, the workability of a printed circuit board is excellent.

The bismaleimide-based compound may be represented by the following Chemical Formula 19.

Chemical Formula 19

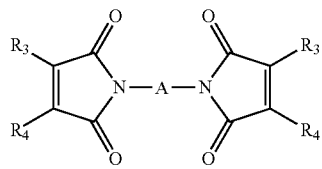

In Chemical Formula 19, $R_3$ and $R_4$ are independently H or $CH_3$, and

A is at least one structural unit selected from the group consisting of a divalent linker including a C2 to C18 alkylene group or an aromatic group, and a linker represented by the following Chemical Formula 19a.

Chemical Formula 19a

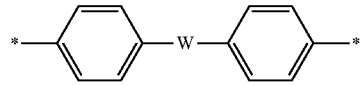

In Chemical Formula, W is O, S, C(=O), S(=O), $SO_2$, a linear or branched C1 to C20 alkyl group, a substituted or unsubstituted C2 to C20 alkylene group, a substituted or unsubstituted C2 to C20 alkoxylene group, a substituted or unsubstituted C2 to C20 alkoxyleneoxy group, a substituted or unsubstituted C6 to C30 arylene group, a substituted or unsubstituted C6 to C30 aryleneoxy group, a substituted or unsubstituted C6 to C30 heteroarylene group, a substituted or unsubstituted C6 to C30 heteroaryleneoxy group, a linker represented by the following Chemical Formula 19b, or a combination comprising at least one of the foregoing.

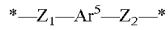

Chemical Formula 19b

In Chemical Formula 19b, $Z_1$ and $Z_2$ are independently, O, S, C(=O), S(=O), $SO_2$, C(=O)NH, or C(=O)O, or a combination comprising at least one of the foregoing, and $Ar^5$ is selected from linkers represented by the following Chemical Formula 19c. A combination comprising at least one of the foregoing linkers may be used.

Chemical Formula 19c

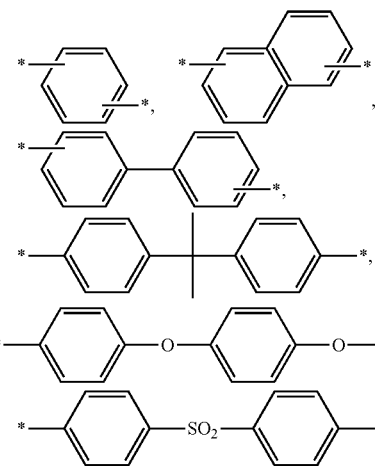

Non-limiting examples of A of the above Chemical Formula 19 include linkers represented by the following Chemical Formula 19d.

[Chemical Formula 19d]

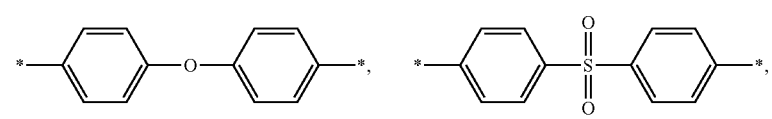

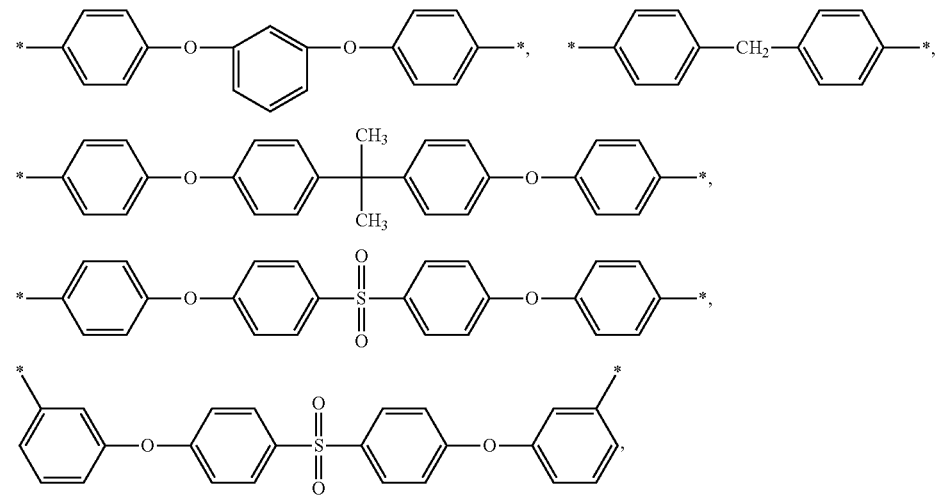

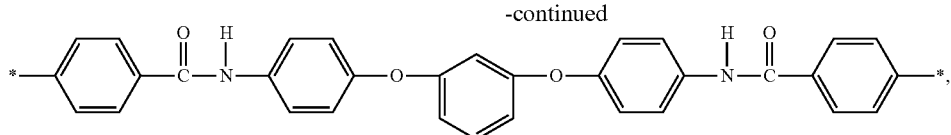

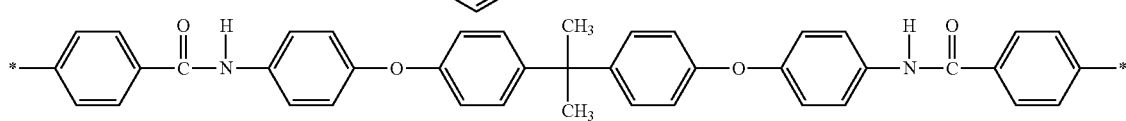

Non-limiting examples of the bismaleimide-based compound include one selected from the group consisting of the compounds of the following Chemical Formulae 20a to 20r, but this disclosure is not limited thereto.

Chemical Formula 20a

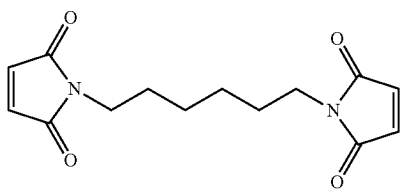

Chemical Formula 20b

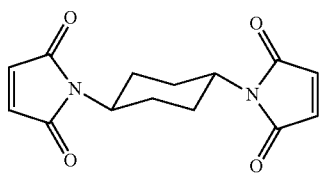

Chemical Formula 20c

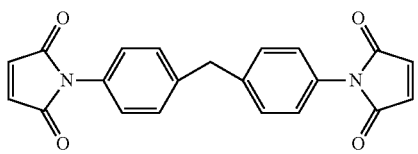

Chemical Formula 20d

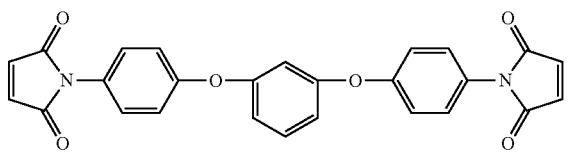

Chemical Formula 20e

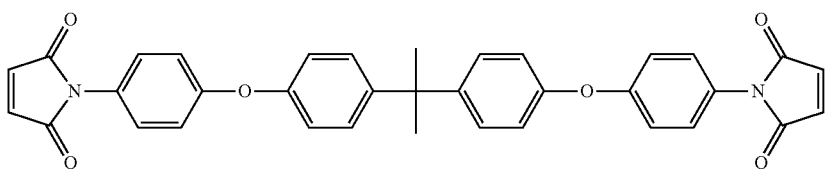

Chemical Formula 20f

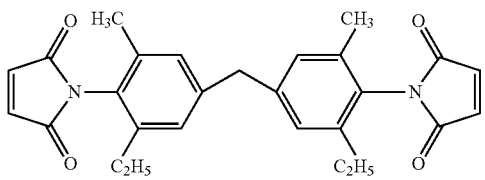

Chemical Formula 20g

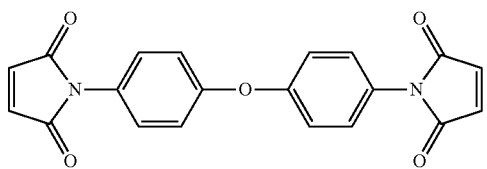

Chemical Formula 20h

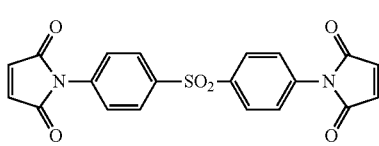

Chemical Formula 20i

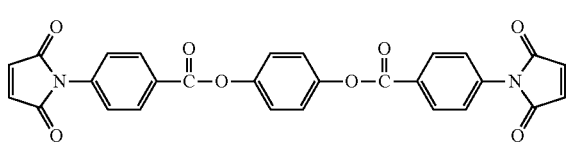

Chemical Formula 20j

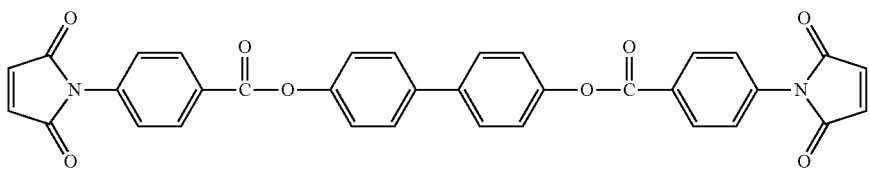

-continued

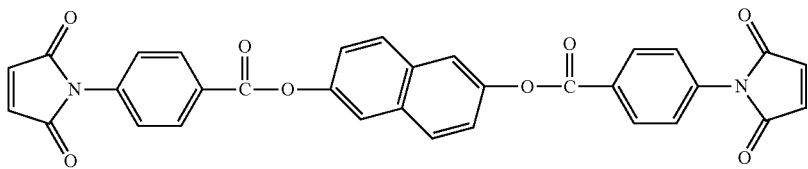
Chemical Formula 20k

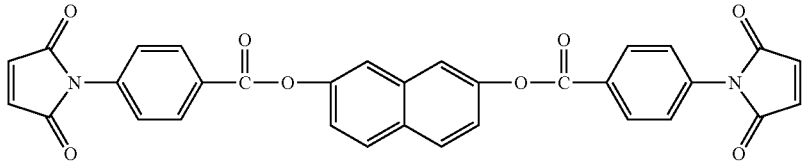
Chemical Formula 20l

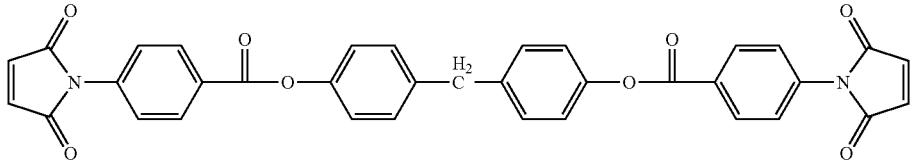
Chemical Formula 20m

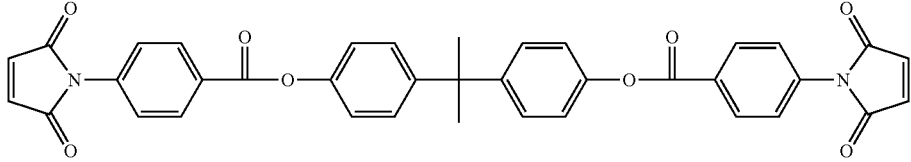
Chemical Formula 20n

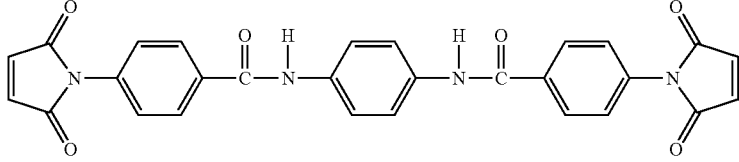
Chemical Formula 20o

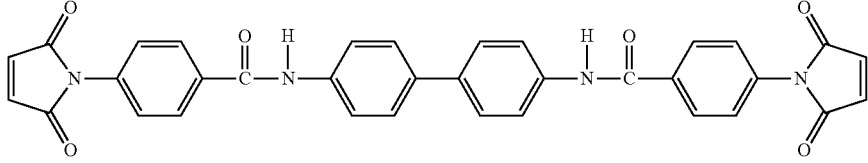
Chemical Formula 20p

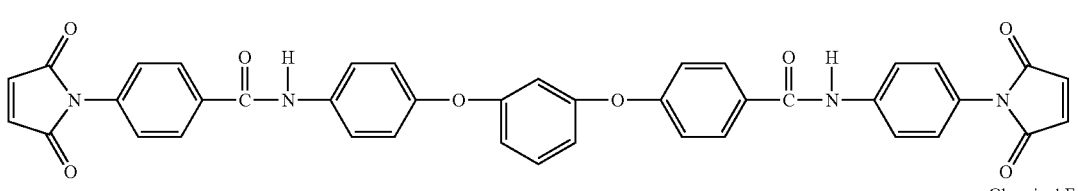
Chemical Formula 20q

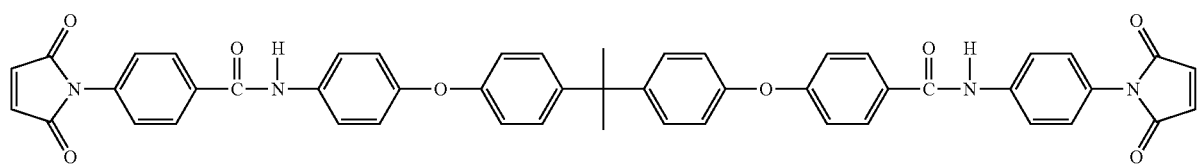
Chemical Formula 20r

The bismaleimide compounds described above may be prepared by, for example, reacting an aromatic diamine with anhydrous maleic acid so as to obtain aromatic bismaleamidic acid, and substituting the aromatic bismaleamidic acid with an aromatic bismaleimide compound through a ring-closing reaction.

Epoxy Compound

The epoxy-based compound includes a phenol-based glycidylether-type epoxy resin such as a cresol novolac-type epoxy resin, a phenol novolac-type epoxy resin, a naphthol modified novolac-type epoxy'resin, a bisphenol A-type epoxy resin, a bisphenol F-type epoxy resin, a biphenyl-type epoxy resin, a triphenyl-type epoxy resin, and the like; an alcohol-based glycidylether-type epoxy resin such as polypropylene glycol glycidyl ether, hydrogen-added bisphenol A-type epoxy resin, or the like; a dicyclopentadiene-type epoxy resin having a dicyclopentadiene backbone; a naphthalene-type epoxy resin having a naphthalene backbone; a dihydroxybenzopyran-type epoxy resin; a dihydroxydinaphthalene-type epoxy resin; a glycidylester-type epoxy resin made from hexahydro phthalic anhydride, a dimer acid, or the like; a glycidylamine-type epoxy resin made from a polyamine such as diamino phenyl methane or the like; an alicyclic-type epoxy resin; a bromide epoxy resin; or a combination comprising at least one of the foregoing. These epoxy-based compounds may thus be used singularly or as a mixture of two or more thereof.

Also, the epoxy compound includes the structure of the following Chemical Formula 21, and its epoxy equivalent weight (grams per equivalent of epoxy; g/eq) is from about 100 to about 400. For example, the epoxy compound includes two of the structures represented by the following Chemical Formula 21, and its epoxy equivalent weight (g/eq) ranges from about 100 to about 150. Also, the epoxy compound includes two or more of the structure represented by the following Chemical Formula 21, and the epoxy equivalent weight is from about 150 to about 200, from about 200 to about 250, or from about 250 to about 300.

Chemical Formula 21

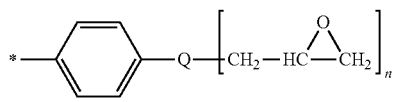

In Chemical Formula 21, Q is O, S, P(R)$_3$, or NR, provided that when Q is O or S, n is 1, and when Q is P(R)$_3$ or NR, n is 1 or 2. R is hydrogen or a C1 to C20 alkyl group.

Fluorinated Polymer Resin Powder

The fluorinated polymer resin may include a fluorinated resin or a fluorinated resin copolymer. For example, the fluorinated polymer resin includes polytetrafluoroethylene (PTFE, also referred to by the tradename TEFLON® polymer), poly(ethylene-co-tetrafluoroethylene), poly(ethylene-co-chlorotrifluoroethylene), poly(vinylidene fluoride), poly(vinylidene fluoride-co-hexafluoropropylene), poly(tetrafluoroethylene-co-hexafluoropropylene), polychlorotrifluoroethylene (PCTFE), or combinations comprising at least one of the foregoing.

The fluorinated polymer resin powder has an average particle diameter about 0.02 µm to about 500 µm. As used herein, particle diameter is synonymous with average particle size and is number average particle size, as determined by methods such as laser light scattering including static and dynamic laser light scattering. When the average granularity (particle diameter or size) of the powder is equal to or less than about 0.02 µm, the specific surface area becomes excessively large and it becomes difficult to add the powder in an amount that may improve the electrical (insulative) characteristics, and when the average granularity of the powder is equal to or greater than about 500 µm, the dispersion stability of the powder deteriorates.

The thermosetting composition may include an organic solvent. The organic solvent may include a polar aprotic solvent. Examples of the solvent include N,N-dimethyl acetamide, N-methylpyrrolidone ("NMP"), N-methylcaprolactam, N,N-dimethyl formamide, N,N-diethylformamide, N,N-diethylacetamide, N-methyl propionamide, dimethylsulfoxide, gamma-butyrolactone, dimethylimidazolidinone, tetramethylphosphoric amide, and ethylcellosolve acetate. These may be used singularly or as a mixture of two or more thereof.

According to one embodiment, the thermosetting composition may include the liquid crystal oligomer in an amount of equal to or greater than about 5 parts by weight to less than about 100 parts by weight based on 100 parts by weight of the entire composition. According to another embodiment, the thermosetting composition may include the liquid crystal oligomer in an amount of equal to or greater than about 5 parts by weight to less than or equal to about 95 parts by weight, equal to or greater than about 10 parts by weight to less than or equal to about 60 parts by weight, or equal to or greater than about 10 parts by weight to less than or equal to about 30 parts by weight. Also, the thermosetting composition may include the bismaleimide-based compound or epoxy compound in an amount of equal to or greater than about 5 parts by weight to less than or equal to about 95 parts by weight, equal to or greater than about 10 parts by weight to less than or equal to about 60 parts by weight, or equal to or greater than about 10 parts by weight to less than or equal to about 30 parts by weight based on 100 parts by weight of the entire composition. Further, the thermosetting composition may include the fluorine-based polymer resin powder in an amount of equal to or greater than about 5 parts by weight to less than or equal to about 95 parts by weight, equal to or greater than about 10 parts by weight to less than or equal to about 60 parts by weight, or equal to or greater than about 10 parts by weight to less than or equal to about 30 parts by weight based on 1.00 parts by weight of the entire composition.

According to one embodiment, the thermosetting composition may include a liquid crystal oligomer in an amount of about 5 to about 95 parts by weight based on 100 parts by weight of an organic solvent. It may also include the bismaleimide-based compound or epoxy compound in an amount of about 5 to about 100 parts by weight based on 100 parts by weight of the organic solvent. The thermosetting composition may include the fluorinated polymer resin powder in an amount of about 5 parts by weight to about 100 parts by weight based on 100 parts by weight of the organic solvent.

The proportion of the liquid crystal oligomer to the bismaleimide-based compound or epoxy compound may not be limited to a specific level. According to one embodiment, the proportion of the liquid crystal oligomer to the bismaleimide-based compound or epoxy compound may be from about 1:9 to about 9:1 in weight ratio.

According to one embodiment of this disclosure, among the solids of the thermosetting composition, the amount of the liquid crystal oligomer may be from about 20 parts by weight to about 80 parts by weight based on the total solids content; the amount of the bismaleimide-based compound may be from about 5 parts by weight to about 30 parts by weight based on the total solids content; the amount of the epoxy compound may be from about 5 parts by weight to about 30 parts by weight based on the total solids content; and the amount of the fluorinated polymer resin powder may be from about 5 parts by weight to about 50 parts by weight based on the total solids content.

According to one embodiment, the thermosetting composition may additionally include diverse polymers, resins, or compounds from which polymers and resins may be derived, such as other thermosetting resins, thermoplastic resins, and oligomers and elastomers thereof as long as the intrinsic characteristics of the composition are not significantly adversely affected. There is no particular restriction as long as the polymers are selected from those polymers generally used. Examples of the polymer, resin, or compound include a phosphorous compound such as phosphoric acid ester and phosphoric acid melamine; a nitrogen-containing compound such as melamine and benzoguanamine; an oxazine cycle-containing compound; a silicon compound; a polyvinyl acetal; a phenoxy resin; an acryl resin; an acryl resin including a hydroxy group or a carboxyl group; an alkyd resin; elastomers such as a polyurethane resin, polybutadiene, a butadiene-acrylonitrile copolymer, polychloroprene, a butadiene-styrene copolymer, polyisoprene, a butyl rubber, a fluoro rubber, and a natural rubber; a styrene-isoprene rubber; an acryl rubber; an epoxylated butadiene; a malated butadiene; polyethylene; polypropylene; a polyethylene-propylene copolymer; polyvinyl chloride; polyvinylidene chloride; polystyrene; polyvinyl toluene; polyvinyl phenol; a styrene-acrylonitrile ("SAN") resin; an acrylonitrile-butadiene-styrene ("ABS") resin; a methacrylate-butadiene-styrene ("MBS") resin; poly-4-fluoroethylene; a fluoroethylene-propylene copolymer; a 4-fluoroethylene-6-fluoroethylene copolymer; a copolymer including a vinyl compound such as vinylidene fluoride; thermoplastic polymers such as polycarbonate, polyester carbonate, polyphenylene ether, polysulfone, polyester, polyether sulfone, polyamide, polyamide imide, polyester imide, polyphenylene sulfite, or low molecular polymers thereof; poly(meth)acrylate polymers of monomers such as (meth)acrylate, epoxy(meth)acrylate, or di(meth)acryloxy-bisphenol; polyallyl compounds such as styrene, vinylpyrrolidone, diacryl phthalate, divinylbenzene, diallylbenzene, diallyl ether bisphenol, trialkenyl isocyanurate, dicyclopentadiene, or a prepolymer thereof; a phenol resin; polymerizable double bond-containing monomers such as an unsaturated polyester or prepolymer; curable monomers such as polyisocyanate or prepolymers thereof; and the like; or a combination comprising at least one of the foregoing.

According to one embodiment, the thermosetting resin composition may further include at least one of additives such as fillers, softening agents, plasticizers, antioxidants, flame retardants, flame-retardant aids, lubricants, antistatic agents, colorants, heat stabilizers, light stabilizers, UV absorbers, or a combination comprising at least one of the foregoing, as needed. Examples of the fillers include organic fillers such as epoxy resin powders, melamine resin powders, urea resin powders, benzoguanamine resin powders, styrene resins, or a combination comprising at least one of the foregoing.

The fillers may be inorganic fillers. The inorganic fillers include generally-used inorganic fillers, but are not particularly limited. Examples of the inorganic fillers include silica such as natural silica, fused silica, amorphous silica, or hollow silica; hydroxides such as aluminum hydroxide, boehmite, or magnesium hydroxide; molybdenum compounds such as molybdenum oxide or zinc molybdate; zinc borate; zinc stannate; aluminum borate; potassium titanate; magnesium sulfate; silicon carbide; zinc oxide; silicon nitride; silicon dioxide; aluminum titanate; barium titanate; barium strontium titanate; aluminum oxide; alumina; clay; kaolin; talc; calcined clay; calcined kaolin; calcined talc; mica; short glass fiber; and the like, or a combination comprising at least one of the foregoing.

Examples of the antioxidant include a phosphorous-containing antioxidant, a phenolic antioxidant, a sulfur-containing antioxidant, and the like, or a combination comprising at least one of the foregoing. Antioxidants are thus used singularly or as a mixture of two or more thereof.

Examples of the plasticizers include polyethylene glycol, a polyamide oligomer, ethylene bissterarrhrhramide, ester phthalate, a polystyrene oligomer, liquid paraffin, polyethylene wax, silicone oil, and the like, or a combination comprising at least one of the foregoing. Plasticizers may thus be used singularly or as a mixture of two or more thereof.

Examples of the flame retardant include brominated polymers such as bromo polystyrene, bromo syndiotactic polystyrene, bromopolyphenylene ether, bromo aromatic compounds such as bromine-containing diphenylalkane or bromine-containing diphenyl ether, and the like, or a combination comprising at least one of the foregoing. In addition, flame-retardant aids may include antimony compounds such as antimony trioxide. The flame retardants and flame-retardant aids may thus be used singularly or as a mixture of two or more thereof.

The thermosetting composition may be prepared by blending the liquid crystal oligomer, bismaleimide-based compound, epoxy compound, and fluorinated polymer resin powder in accordance with various methods, such as mixing at room temperature or melt-mixing the same. The blending method is not particularly limited. For example, the thermosetting composition may be prepared by simply melt-mixing the components, or by dissolving and mixing the liquid crystal polymer and the bismaleimide-based compound in an organic solvent such as for example methylethylketone, N-methylpyrrolidone, dimethyl formamide, dimethyl acetamide, toluene, xylene, or a combination comprising at least one of the foregoing.

The thermosetting composition may be used as a varnish for impregnation and/or coating.

Another embodiment of this disclosure provides a resin cured product that includes a cross-linked product of a thermosetting composition including the liquid crystal oligomer; and a bismaleimide-based compound, an epoxy compound, and a fluorinated polymer resin powder. Another embodiment of this disclosure provides a board including the resin cured product and a storage medium.

The resin cured product may be manufactured by applying and drying the thermosetting composition, and it may be molded in the form of sheet or a board.

A prepreg may be formed of the thermosetting composition. The prepreg is formed by impregnating the thermosetting composition in a reinforcing material. In particular, the prepreg may be formed by impregnating a thermosetting composition into a reinforcing material, and performing a curing process to form it in the shape of a sheet.

The thermosetting composition not only has thermosetting characteristics by including a liquid crystal oligomer, a bismaleimide-based compound, and an epoxy compound, but also has excellent impregnation characteristic for the reinforcing material. Therefore, the thermosetting composition has excellent workability as well as superb water resistance and mechanical strength. Also, the fluorinated polymer resin powder inside the thermosetting composition may be dispersed into a resin layer of the prepreg so as to have excellent electrical insulation characteristics.

The reinforcing material for a prepreg may include, for example, glass cloth, alumina glass cloth, glass fiber non-woven fabric, cellulose non-woven fabric, carbon cloth, and polymer cloth. Non-limiting examples of the reinforcing material include inorganic fibers such as glass fibers, silica glass fibers, carbon fibers, alumina fibers, silicon carbide fibers, asbestos, rock wools, mineral wools, plaster whiskers, woven fabrics thereof or non-woven fabrics thereof, or mixtures thereof; organic fibers such as aromatic polyamide fibers, polyimide fibers, liquid crystal polyesters, polyester fibers, fluorine fibers, polybenzoxazole fibers, and the like; combined woven fabrics such as glass fibers including polyamide fibers, glass fibers including carbon fibers, glass fibers including polyimide fibers, and glass fibers including aromatic polyesters; inorganic papers such as glass paper, mica paper, alumina paper, and the like; mixed fiber of the above-described reinforcing materials such as craft paper, cotton paper, paper-glass bond paper; and the like, or a combination comprising at least one of the foregoing.

The prepreg may be prepared by coating or impregnating a reinforcing material with the thermosetting composition, drying to remove the solvent, and further removing any residual solvent. Although the prepreg is prepared by coating the reinforcing material with the thermosetting composition or impregnating the thermosetting composition into the reinforcing material and performing a drying process, the coating method, the impregnation method, and the drying method are not limited to particular ones, and conventionally known methods may be used. As for the method for impregnating the thermosetting composition into the reinforcing material, dip coating and roll coating may be used. In addition, typical impregnation methods may be used.

The impregnation amount of a resin cured product of the prepreg may be from about 40 to about 70 wt %. When the impregnation amount of the resin is less than about 40 wt %, the close contacting property between prepregs may deteriorate when more than two prepregs are used. When the impregnation amount of the resin exceeds about 70 wt %, the mechanical strength of the acquired prepreg may also deteriorate and dimensional stability may deteriorate. The resin impregnation amount (in wt %) signifies the total amount of the resin penetrated into and attached to a reinforcing material and the resin existing on the surface of the reinforcing material based on the total weight of the prepreg. The resin existing on the surface of the reinforcing material includes the resin laminated on the surface of the reinforcing material surface.

The prepreg has a low thermal expansion rate. For example, the prepreg may have a thermal expansion rate of equal to or lower than about 25 ppm/° C. or equal to or less than about 20 ppm/° C. at a temperature of from about 50 to about 150° C.

Also, the prepreg has a low dielectric characteristic. For example, the dielectric constant may be from about 3.5 to about 2.5 at about 1 GHz, and the dielectric loss may be from about 0.05 to about 0.001.

A board may be manufactured using the thermosetting composition. The board is not particularly limited. For example, the board may be one of a multi-layer board, a laminate bound with a metal foil, and a printed board. Also, the prepreg may have the form of a board bound with a metal foil.

The board may have several shapes, for example, a film shape. The film may be provided by making the thermosetting resin composition as a thin film. Examples of the method include an extruding and molding method for forming the thermosetting composition into a film through a die; a cast molding method for forming the thermosetting composition into a film through casting; and a dip molding method for forming a film-type substrate by dipping a material such as an inorganic board, e.g., glass or fabric in a varnish of the thermosetting composition to mold the board into a film. However, this disclosure is not limited thereto.

The board may have a form of a laminate bound with a metal foil. The metal foil may include copper foil, aluminum foil, alloys thereof, or the like, or a combination comprising at least one of the foregoing. The thickness of the metal foil is different depending upon the usage, but it may be, for example, from 5 to about 100 μm. The metal foil may be bound with the surface of a resin laminate. The metal foil of the laminate surface may be patterned. For example, the metal foil is treated with a circuit process (e.g., etching process) to provide a flexible printed circuit ("FPC") board. On the surface of the printed laminate, the metal foil coated laminate is similarly laminated and processed to provide a multi-layer flexible printed circuit (FPC) board.

The laminate bound with metal foil may be manufactured by coating the thermosetting composition on the metal foil (e.g., copper foil) or casting the same on the metal foil (e.g., copper foil), removing the solvent, and heating the same. The solvent is removed by, for example, evaporation. In order to evaporate the solvent, it may be heated under a reduced pressure or may be ventilated.

The coating of the thermosetting resin composition may be performed by roller coating, dip coating, spray coating, spin coating, curtain coating, slit coating, screen printing, and the like, but is not limited thereto. According to one embodiment, the thermosetting resin composition may be filtered using a filter before coating or casting on the copper foil in order to remove fine impurities included in the solution, or to remove gross particulate impurities (i.e., those with a particle size greater than that of the fluorinated polymer resin powder).

In addition, the flexible printed circuit (FPC) may be manufactured by laminating an interlayer board, prepreg, and metal foil in accordance with the design specification, inputting it into a press, and pressing and heating the same to fuse/cure the prepreg and attach the copper foil and the inner board. Also, the printed circuit board may be manufactured by forming a conductive pattern on one side or both sides of the prepreg, or the printed circuit board may be manufactured by laminating a plurality of prepregs to achieve multilayered structures such as those having 4 layers or 8 layers, but not limited thereto. The conductor pattern may be formed through an etching process.

The laminate bound with the metal may be used as one component of a flexible printed circuit (FPC), and includes, for example, a resin coated copper ("RCC"), a copper clad laminate ("CCL"), or the like.

The flexible printed circuit (FPC) may be applied to a storage medium such as a hard disk drive ("HOD"), a solid state drive ("SSD"), a memory stick, or the like, or to various devices using a flexible printed circuit (FPC). For example, the flexible printed circuit (FPC) may be electrically connected to a memory chip by mounting the memory chip through a lead or without a lead.

For the requirement of the storage medium to be slimmer and to have a higher driving speed, the flexible printed circuit (FPC) is required to have higher density by accomplishing multi-layers and decreasing the board thickness, the diameter of a through-hole, the distance between hole gaps, or the like. For example, an SSD may accomplish a more rapid driving speed than the common HDD by using a flash memory chip. For this purpose, the flexible printed circuit (FPC) is required to be thinner and to have higher density than those in the common HDD. However, when the thickness of the board is decreased, it is difficult to ensure the low dielectric characteristic and low thermal expansion coefficient at an appropriate level. However, the flexible printed circuit (FPC) according to the various embodiments has a low thermal expansion coefficient and a low dielectric characteristic, so it may also be usefully applied to a next-generation storage medium such as the SSD.

The SSD (solid state device) may include a complementary metal oxide semiconductor ("CMOS") device, a metal oxide semiconductor ("MOS") device, a conductor-insulator-semiconductor ("CIS") device, an electro-optical device, a mono-atomic device, a mono-molecular device, a mono-hole device, a mono-atomic PN junction device, a mono-molecular PN junction device, a mono-electronic device, a one-dimensional solid device, a two-dimensional solid device, or a three-dimensional solid device.

Hereinafter, this disclosure is illustrated in more detail with reference to examples. However, they are exemplary embodiments and are not limiting.

EXAMPLES

Synthesis Example 1

Synthesis of Liquid Crystal Oligomer Having a Nadimide Terminal End Group 16.6 g of isophthalic acid (0.10 mol), 37.636 g of 6-hydroxy-2-naphtoic acid (0.20 mol), 27.6 g of 4-hydroxy-benzoic acid (0.20 mol), 21.8 g of 4-aminophenol (0.20 mol), and 83 ml of acetic anhydride (0.88 mol) are put into a 500 ml flask with a condenser and a mechanical stirrer, and an acetylation reaction is completed by gradually increasing the temperature to about 140° C. under a nitrogen atmosphere and inducing the reaction for about 3 hours while maintaining the temperature. Subsequently, a liquid crystal oligomer represented by Chemical Formula 27c is synthesized by adding 54.6 g of tetrahydro phthalimide benzoic acid (0.20 mol) thereto, and then increasing the temperature to about 215° C. at a rate of about 1-2° C. per minute while removing acetic acid, which is a reaction by-product, and un-reacted acetic anhydride, and inducing the reaction at the temperature for about 4 hours. The resulting material is pulverized with a pulverizer so as to become a powder, and obtained in quantitative yield. $^1$H-NMR spectrum of the synthesized liquid crystal oligomer is shown in FIG. 1.

Synthesis Example 2

Synthesis of Liquid Crystal Oligomer Having Hydroxy Group-Terminal End 29.9 g of isophthalic acid (0.18 mol), 16.9 g of 6-hydroxy-2-naphtoic acid (0.09 mol), 18.6 g of 4-hydroxy-benzoic acid (0.135 mol), 24.6 g of 4-aminophenol (0.225 mol), and 68.9 g of acetic anhydride (0.675 mol) are put into a 500 ml 4-neck flask. The flask is equipped with a sealed mechanical agitator, a nitrogen injection tube, a thermometer, and a reflux condenser. The air in the inside of the reactor is replaced with nitrogen gas, and the temperature inside the reactor is gradually increased to about 140° C. with the flow of nitrogen gas and reflux is performed for about 3 hours while maintaining the temperature inside the reactor. Subsequently, a liquid crystal oligomer represented by Chemical Formula 12 is prepared by additionally adding 8.5 g of 6-hydroxy-2-naphtoic acid (0.045 mol) thereto, increasing the temperature to about 270° C. while removing acetic acid, which is a reaction by-product, and un-reacted acetic anhydride, and inducing the reaction for about 30 minutes.

Example 1

Example 1-1

Preparation of Thermosetting Composition

A mixed solution is prepared by adding 6.0 g of the liquid crystal oligomer acquired in Synthesis Example 1, 6.0 g of the liquid crystal oligomer acquired in Synthesis Example 2, 4.0 g of 4,4'-bismaleimidodiphenylmethane (BMI-1000, available from Daiwa Kasei company), 4.0 g of an epoxy compound Araldite MY-721 (available from Huntsman company), and 0.04 g of a curing catalyst dicyandiamide ("DICY") to 30 g of N-methylpyrrolidone (NMP). An impregnation solution is prepared by mixing the mixed solution with 8.4 g of polytetrafluoroethylene (PTFE) powder (available from DuPont company, average granularity: 30 µm) and dispersing the mixed solution for about 24 hours by using a ball mill and then using a 3-roll mill.

Example 1-2

Preparation of Prepreg

Glass fiber (fiber thickness 45 µm) of a 40×40×0.05 (mm) sheet size is placed on copper foil fixed on a glass plate, and the thermosetting composition prepared according to Example 1-1 is evenly impregnated into the glass fiber. The prepreg is acquired by increasing the temperature from room temperature to about 200° C. in a high-temperature furnace, curing a specimen that is impregnated for about 100 minutes, and removing the copper foil by treating the acquired specimen with about 50 parts by weight of an aqueous nitric acid solution. The resin impregnation rate is about 56 wt %. Herein, the resin impregnation rate (wt %) signifies the total amount of the resin impregnated into a reinforcing material and the resin existing on the surface of the reinforcing material prepreg based on the total amount of prepreg. The resin existing on the surface of the reinforcing material included what is laminated on the surface of the reinforcing material.

Example 2

A thermosetting composition and prepreg are prepared according to the same method as Examples 1-1 and 1-2, except that for Example 1-1, polytetrafluoroethylene (PTFE) powder is used in an amount of about 5.6 g instead of 8.0 g.

Example 3

A thermosetting composition and prepreg are prepared according to the same method as Examples 1-1 and 1-2, except that for Example 1-1, polytetrafluoroethylene (PTFE) powder is used in an amount of about 4.0 g instead of 8.0 g.

Comparative Example 1

A thermosetting composition and prepreg are prepared according to the same method as Examples 1-1 and 1-2, except that for Example 1-1, polytetrafluoroethylene (PTFE) powder is not used.

Evaluation of Thermal Characteristic of Prepreg

Figure 2:
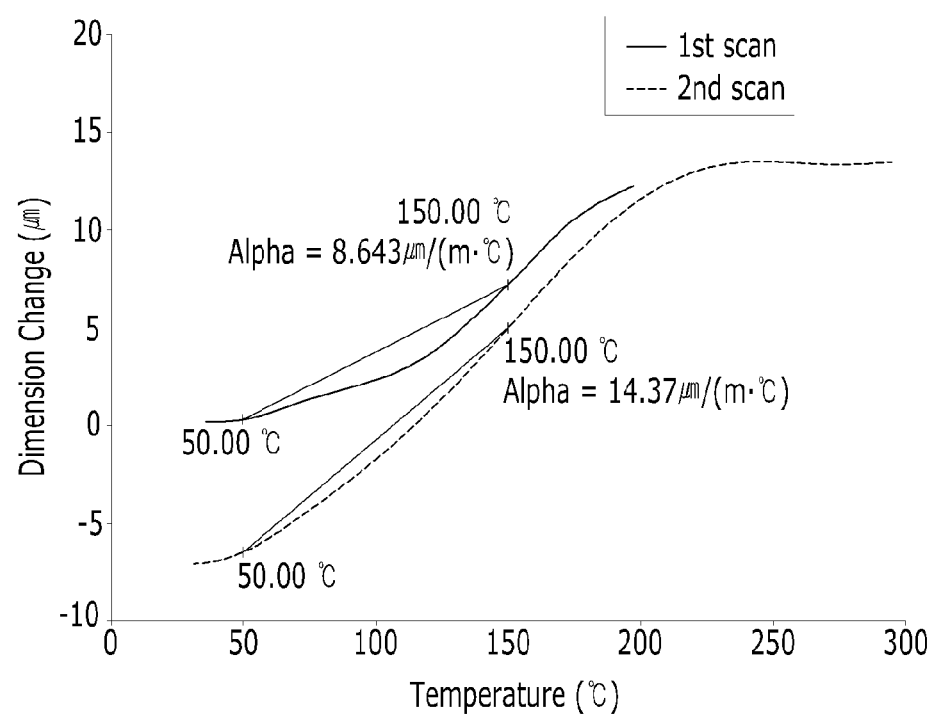
FIG. 2 shows thermomechanical analysis ("TMA") results of a prepreg synthesized according to Example 1.

The thermal expansion coefficients (CTE) of the prepared prepreg specimens are measured using a Thermomechanical Analyzer (TMA, from TA Instruments TMA 2940), and the results are shown in Table 1 for first ($1^{st}$) and second ($2^{nd}$) successive runs. The thermal expansion coefficients are measured under nitrogen atmosphere, and the temperature is increased at a rate of about 10° C./min during the measurement. The measurement results are as shown in Table 1. TMA results for the prepreg prepared according to Example 1 are shown in FIG. 2.

Evaluation of Dielectric Characteristic of Prepreg

A half-cured glass fiber prepreg is prepared by impregnating a thermosetting composition into glass fiber and performing a heat treatment at about 180° C. for about 20 minutes. A copper foil laminate having a total thickness of equal to or greater than about 300 μm is manufactured by laminating 8 sheets of the half-cured prepreg with copper foil disposed on both sides and applying pressure with a press at about 200° C. for about 100 minutes. The copper foil laminate is treated with 50 parts by weight of nitric acid solution so as to acquire a prepreg without a copper foil, and the impedance is measured with an RF Impedance Analyzer (E4991A, Agilent Company) at a frequency of about 1 GHz.

The measurement results are as shown in Table 1.

TABLE 1

|  | Resin impregnation ratio (wt %) | Dielectric characteristic | | Thermal expansion coefficient ($1^{st}/2^{nd}$) (ppm/° C.) |
|---|---|---|---|---|
|  |  | Dielectric constant (Dk) | Dielectric loss (Df) |  |
| Example 1 | 56 | 2.97 | 0.0119 | 8.6/14.4 |
| Example 2 | 54 | 3.35 | 0.0183 | 7.6/12.7 |
| Example 3 | 55 | 3.36 | 0.0184 | 10.9/15.4 |
| Comparative Example 1 | 57 | 3.50 | 0.0195 | 10.0/20.1 |

Example 4

Example 4-1

Preparation of Thermosetting Composition

A mixed solution is prepared by adding 6.0 g of the liquid crystal oligomer acquired in Synthesis Example 1, 6.0 g of the liquid crystal oligomer acquired in Synthesis Example 2, 4.0 g of 4,4'-bismaleimidodiphenylmethane (BMI-1000) (Daiwa Kasei company), 4.0 g of an epoxy compound Araldite MY-721 (Huntsman company), and 0.04 g of a curing catalyst dicyandiamide (DICY) to 30 g of N-methylpyrrolidone (NMP). An impregnation solution is prepared by mixing the mixed solution with 13.3 g of polytetrafluoroethylene (PTFE) powder (DuPont company, average granularity: 30 μm), and dispersing the mixed solution for about 24 hours by using a ball mill.

Example 4-2

Preparation of Prepreg

Glass fiber (fiber thickness 45 μm) of a 40×40×0.05 (mm) sheet size is put on an electrolyte copper foil fixed on a glass plate, and the solution prepared according to Example 1-1 is evenly impregnated into the glass fiber. A prepreg is acquired by increasing the temperature of a high-temperature furnace from room temperature to about 200° C. so as to cure the impregnated specimen for about 100 minutes and treating the acquired specimen with 50 parts by weight of nitric acid solution so as to remove the copper foil. The resin impregnation rate is about 49 wt %.

Comparative Example 2

A thermosetting composition and a prepreg are prepared according to the same method as Examples 4-1 and 4-2, except that polytetrafluoroethylene (PTFE) powder is not used for Example 4-1. The resin impregnation rate is about 52 wt %.

Evaluation of Dielectric Characteristic of Prepreg

A half-cured glass fiber prepreg is prepared by impregnating a thermosetting composition into glass fiber and performing a heat treatment at about 180° C. for about 20 minutes. A copper foil laminate having a total thickness of equal to or greater than about 300 μm is manufactured by laminating 8 sheets of the half-cured prepreg with a copper foil disposed on both sides, and applying pressure with a press at about 200° C. for about 100 minutes. A prepreg without copper foil is prepared by treating the copper foil laminate with about 50 parts by weight of a nitric acid solution, and impedance is measured with an RF Impedance Analyzer (E4991A, Agilent Company) at a frequency of about 1 GHz.

The measurement results are as shown in Table 2.

TABLE 2

|  | Resin impregnation ratio (wt %) | Dielectric constant (Dk) | Dielectric loss (Df) |
|---|---|---|---|
| Example 4 | 49 | 2.45 | 0.011 |
| Comparative Example 2 | 52 | 3.47 | 0.034 |

The embodiments of this disclosure thus show both low dielectric characteristics and low thermal expansion rates.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thermosetting composition comprising:
   a liquid crystal oligomer; a bismaleimide-based compound; an epoxy compound; and a fluorinated polymer resin powder,
   wherein the liquid crystal oligomer comprises a backbone represented by the following Chemical Formula 1:

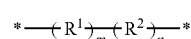

Chemical Formula 1 wherein, in Chemical Formula 1, $R^1$ is represented by the following Chemical Formula 2, $R^2$ is represented by the following Chemical Formula 6, and n and m are independently integers of from 1 to 100:

Chemical Formula 2 wherein, in Chemical Formula 2, $X^1$ and $Y^1$ are independently O, NR'', or C(=O), where R'' is hydrogen, a substituted or unsubstituted C1 to C20 alkyl group, or a substituted or unsubstituted C6 to C30 aryl group, $Ar^1$ includes a divalent aromatic organic group or aliphatic cyclic group represented by any of the following Chemical Formula 3-1 to 3-11, where at least one hydrogen in the cycle group is substituted or unsubstituted:

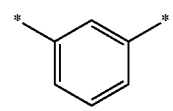

Chemical Formula 3-1

-continued

Chemical Formula 3-2

Chemical Formula 3-3
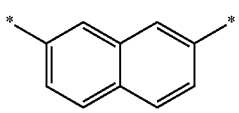

Chemical Formula 3-4
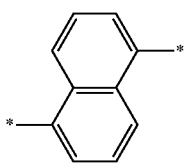

Chemical Formula 3-5
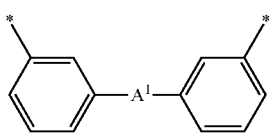

Chemical Formula 3-6
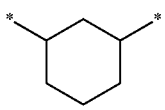

Chemical Formula 3-7
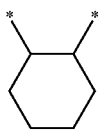

Chemical Formula 3-8
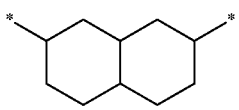

Chemical Formula 3-9
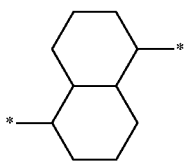

Chemical Formula 3-10
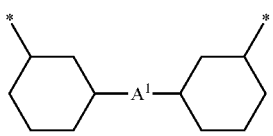

Chemical Formula 3-11
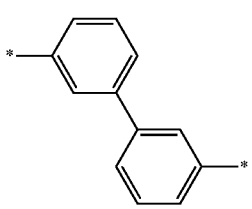

wherein, in Chemical Formula 3-5 and 3-10, $A^1$ is a single bond, a divalent heteroatom group, or a divalent aliphatic organic group, aromatic organic group, or a combination comprising at least one of the foregoing:

*—$X^2$—$Ar^3$—$Y^2$—*  Chemical Formula 6 wherein, in Chemical Formula 6, $X^2$ and $Y^2$ are independently O, NR", or C(=O), where R" is hydrogen, a substituted or unsubstituted C1 to C20 alkyl group, a substituted or unsubstituted C6 to C30 aryl group, or a combination comprising at least one of the foregoing, and $Ar^3$ includes at least one of a divalent aromatic organic group, aliphatic cyclic group, or a combination comprising at least one of the foregoing represented by any of the following Chemical Formula 7-1 to 7-9:

Chemical Formula 7-1
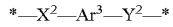

Chemical Formula 7-2

Chemical Formula 7-3
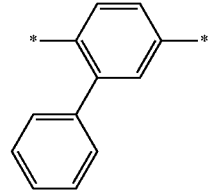

Chemical Formula 7-4
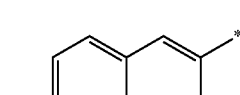

Chemical Formula 7-5
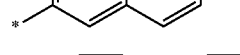

Chemical Formula 7-6
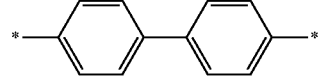

Chemical Formula 7-7
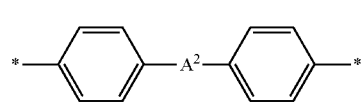

Chemical Formula 7-8
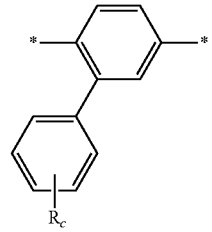

-continued

Chemical Formula 7-9

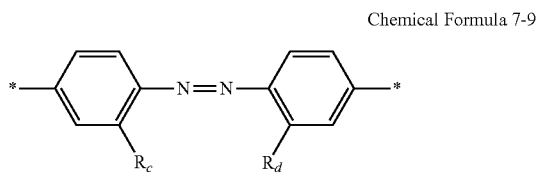

Chemical Formula 8a

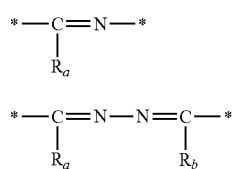

Chemical Formula 8b

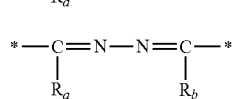

wherein, in Chemical Formula 7-5, $A^2$ is a divalent heteroatom group, aliphatic organic group, aromatic organic group, or a combination comprising at least one of the foregoing, and wherein, in Chemical Formulae 7-6, 7-7, 7-8, and 7-9, $R_c$ and $R_d$ are independently a C1 to C5 alkyl group or a halogen.

2. The thermosetting composition of claim 1, wherein $R^1$ as a divalent aromatic or aliphatic ring structural unit is linked in an ortho position or a meta position where the aromatic ring is a 6-membered ring, or at the 1,2- or 1,3 position where $R^1$ is an aliphatic ring structural unit.

3. The thermosetting composition of claim 1, wherein $A^1$ of Chemical Formula 3-5 and 3-10 is selected from O, S, C(=O), S(=O), $SO_2$, a substituted or unsubstituted C2 to C20 alkylene group, a substituted or unsubstituted C2 to C20 alkoxylene group, a substituted or unsubstituted C2 to C20 alkoxyleneoxy group, a substituted or unsubstituted C6 to C30 arylene group, a substituted or unsubstituted C6 to C30 aryleneoxy group, a substituted or unsubstituted C6 to C30 heteroarylene group, a substituted or unsubstituted C6 to C30 heteroaryleneoxy group, a linker represented by the following Chemical Formula 3a, a linker represented by the following Chemical Formula 3b, or a combination comprising at least one of the foregoing:

Chemical Formula 3a

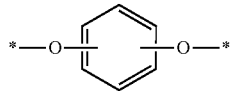

Chemical Formula 3b

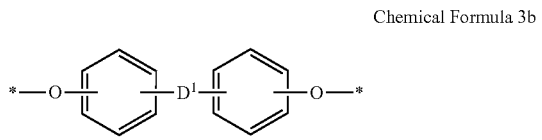

wherein, in Chemical Formula 3b, $D^1$ is O, S, C(=O), S(=O), $SO_2$, a linear or branched C1 to C20 alkylene group, or a combination comprising at least one of the foregoing.

4. The thermosetting composition of claim 1, wherein $A^2$ in Chemical Formula 7-5 is $N_2$, O, S, C(=O), S(=O), $SO_2$, a substituted or unsubstituted C2 to C20 alkylene group, a substituted or unsubstituted C2 to C20 alkenylene group, a substituted or unsubstituted C2 to C20 alkoxylene group, a substituted or unsubstituted C2 to C20 alkoxyleneoxy group, a substituted or unsubstituted C6 to C30 arylene group, a substituted or unsubstituted C6 to C30 aryleneoxy group, a substituted or unsubstituted C6 to C30 heteroarylene group, a substituted or unsubstituted C6 to C30 heteroaryleneoxy group, a linker represented by Chemical Formulae 8a and 8b, or a combination comprising at least one of the foregoing:

wherein, in Chemical Formulae 8a and 8b, $R_a$ and $R_b$ are independently hydrogen, a halogen, a C1 to C5 alkyl group, or a C1 to C5 haloalkyl group.

5. The thermosetting composition of claim 1, wherein m/(n+m+2) in Chemical Formula 1 is greater than about 0.05 and less than or equal to about 0.6.

6. The thermosetting composition of claim 1, wherein the liquid crystal oligomer comprises a hydroxy group, an amine group, a carboxyl group, an acetyl group, or a thiol group at each terminal end, and at least one terminal end includes an organic group including a hydroxy group.

7. The thermosetting composition of claim 6, wherein the liquid crystal oligomer comprises a liquid crystal oligomer represented by the following Chemical Formulae 11a to 11d:

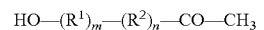   Chemical Formula 11a

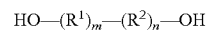   Chemical Formula 11b

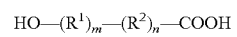   Chemical Formula 11c

   Chemical Formula 11d wherein, in Chemical Formulae 11a to 11d, $R^1$ is a structural unit represented by any of Chemical Formulae 4-1 to 4-3, $R^2$ is a structural unit represented by any of Chemical Formulae 9-1 to 9-6, and m and n are integers of from 1 to 100:

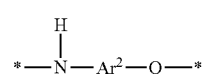   Chemical Formula 4-1

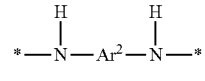   Chemical Formula 4-2

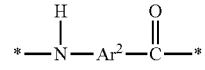   Chemical Formula 4-3 wherein, in Chemical Formula 4-1 to 4-3, $Ar^2$ is selected from a group of the following Chemical Formulae 5-1 to 5-11:

Chemical Formula 5-1

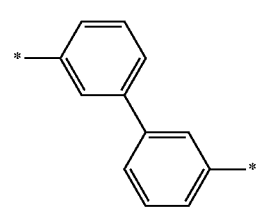

Chemical Formula 5-2
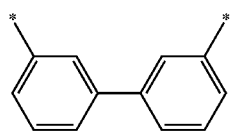

Chemical Formula 5-3
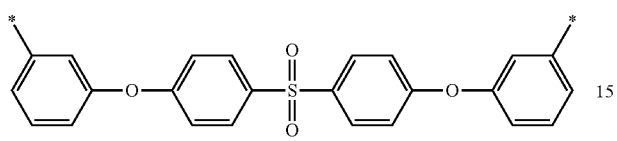

Chemical Formula 5-4
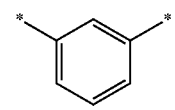

Chemical Formula 5-6
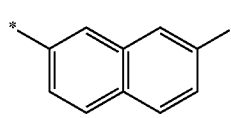

wherein, in Chemical Formulae 9-1 to 9-6, $Ar^4$ is selected from groups represented by the following Chemical Formulae 10-1 to 10-11:

Chemical Formula 10-1

Chemical Formula 10-2
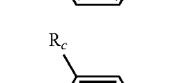

Chemical Formula 10-3
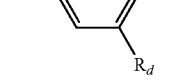

Chemical Formula 10-4
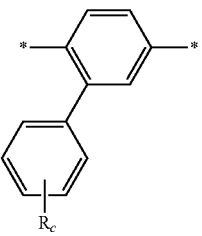

Chemical Formula 10-5
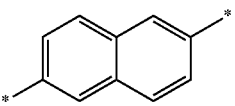

Chemical Formula 10-6
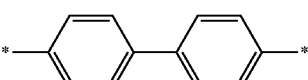

Chemical Formula 10-7
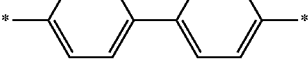

Chemical Formula 10-8
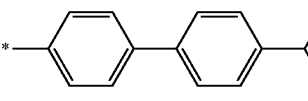

Chemical Formula 10-9
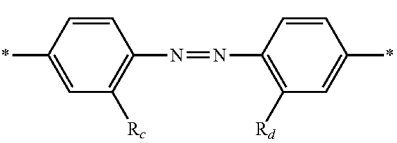

Chemical Formula 10-10
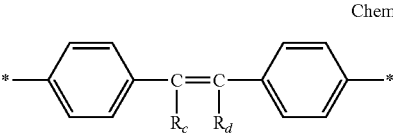

Chemical Formula 10-11
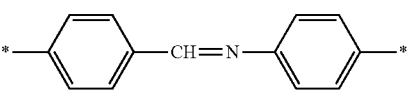

wherein, in Chemical Formulae 10-2, 10-3, 10-4, 10-8, 10-9, and 10-11, $R_c$ and $R_d$ are independently hydrogen, a C1 to C5 alkyl group, or a halogen.

8. The thermosetting composition of claim 6, wherein the liquid crystal oligomer is selected from the compounds represented by the following Chemical Formulae 13a-13e, 14a-14e, 15a-15e, 16a-16e, or 17a-17e:

Chemical Formula 13a
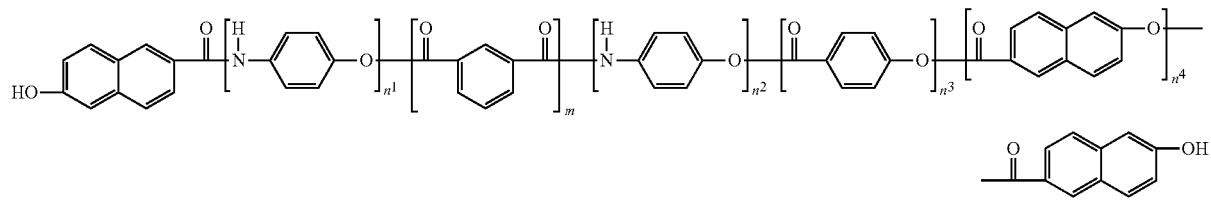

-continued
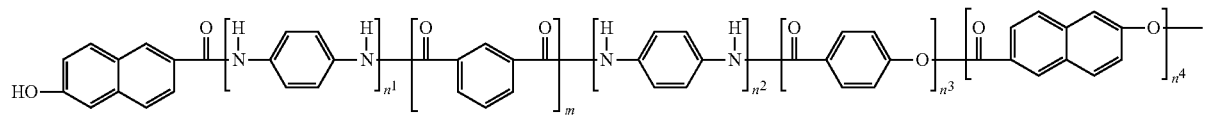
Chemical Formula 13b
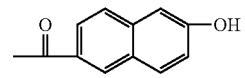
Chemical Formula 13c
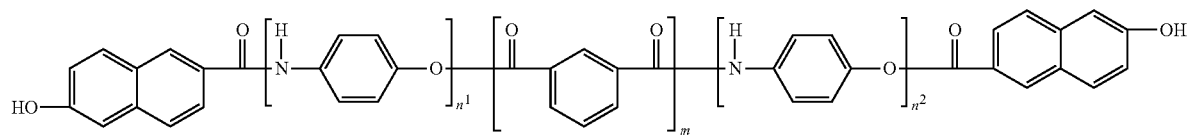
Chemical Formula 13d
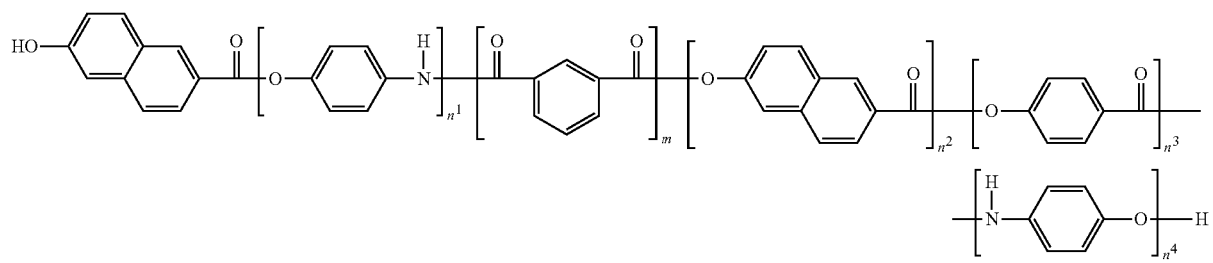
Chemical Formula 13e
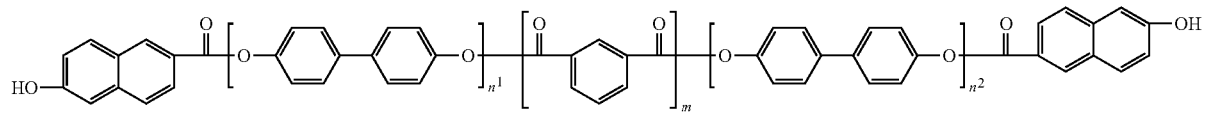
Chemical Formula 14a
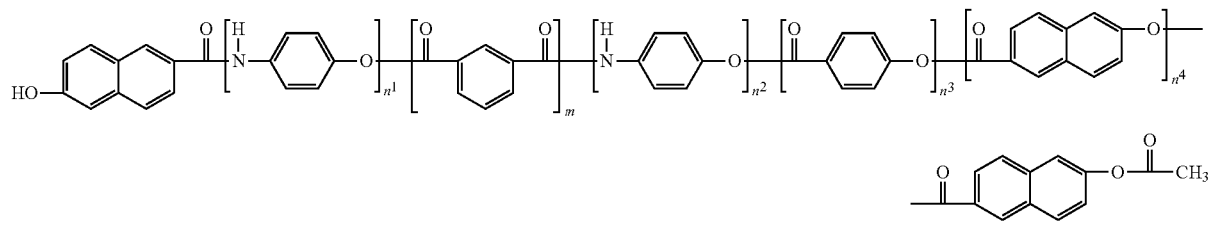
Chemical Formula 14b
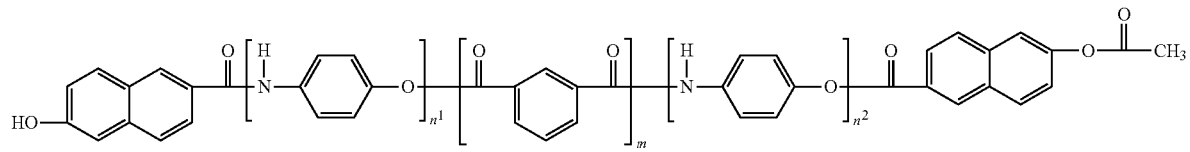
Chemical Formula 14c
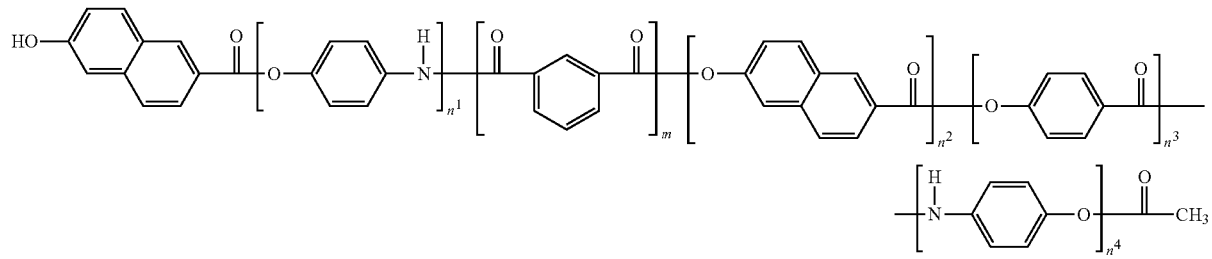

Chemical Formula 14d
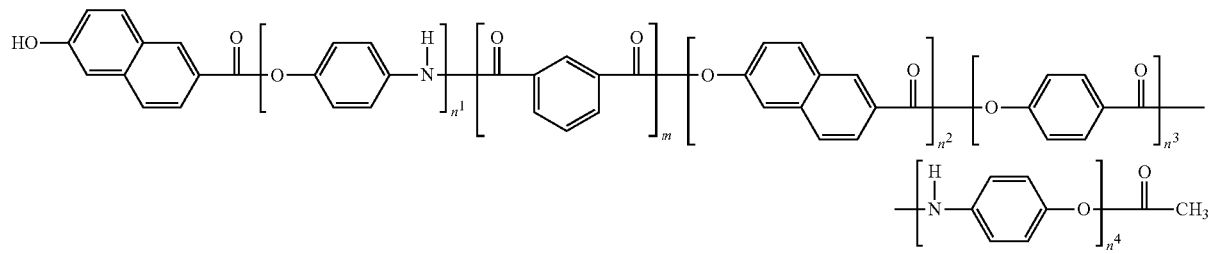
Chemical Formula 14e
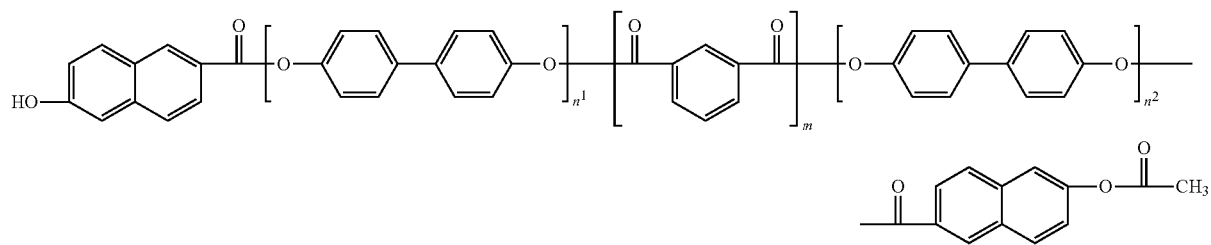
Chemical Formula 15a
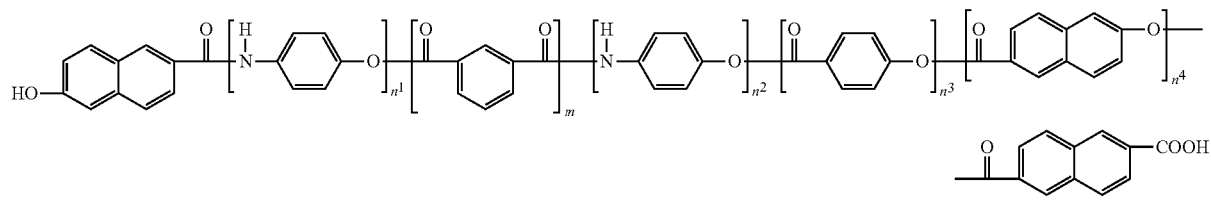
Chemical Formula 15b
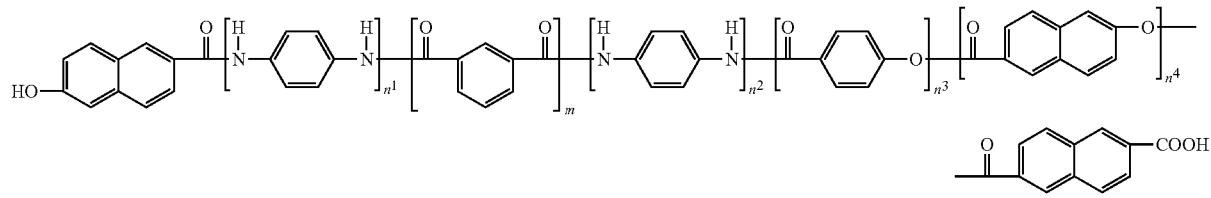
Chemical Formula 15c
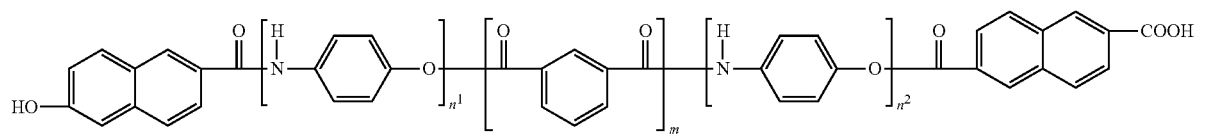
Chemical Formula 15d
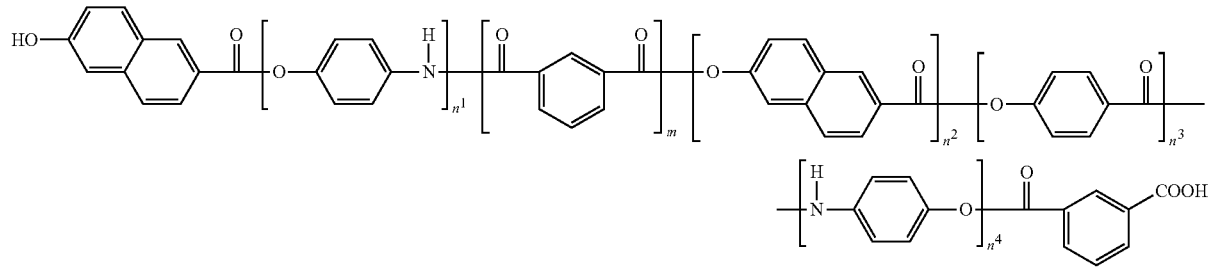
Chemical Formula 15e
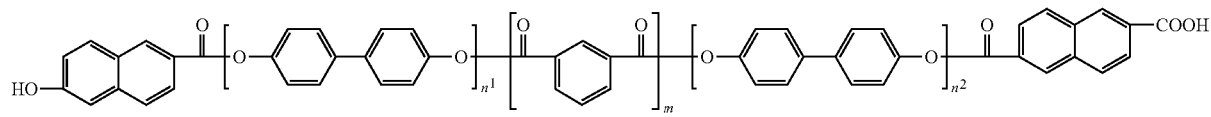

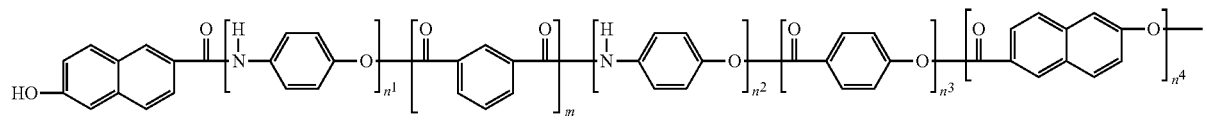
Chemical Formula 16a
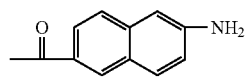
Chemical Formula 16b
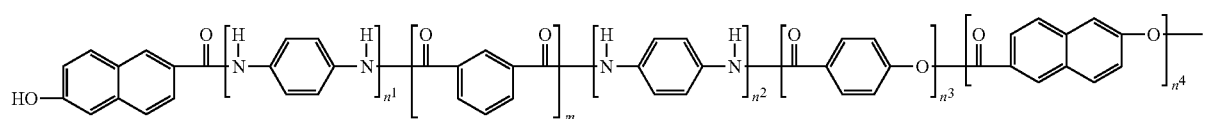
Chemical Formula 16c
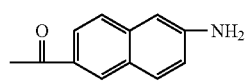
Chemical Formula 16d
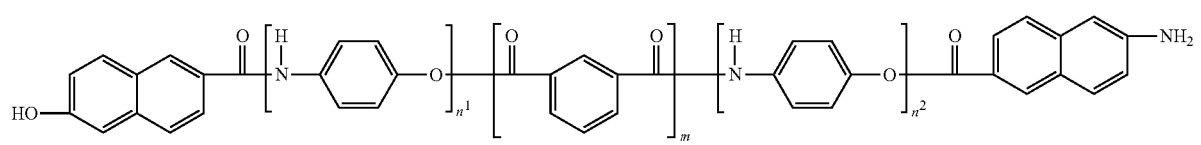
Chemical Formula 16e
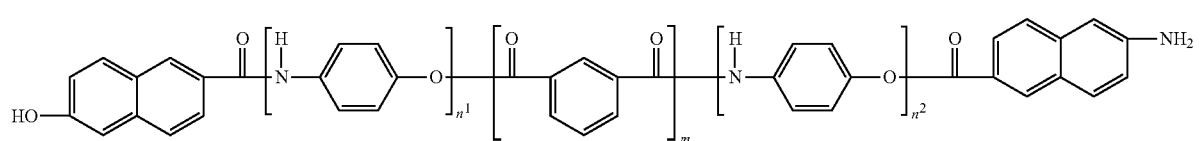
Chemical Formula 17a
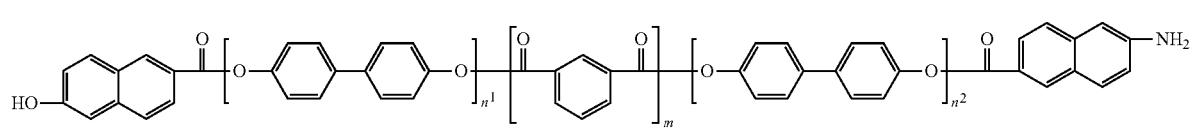
Chemical Formula 17b
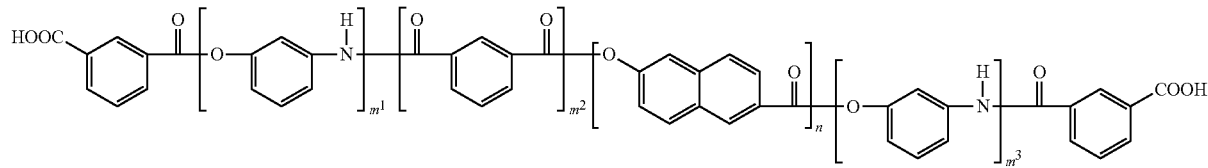
Chemical Formula 17c
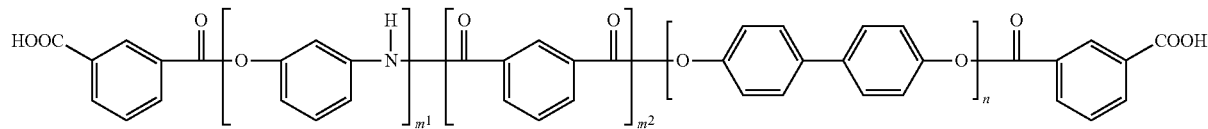
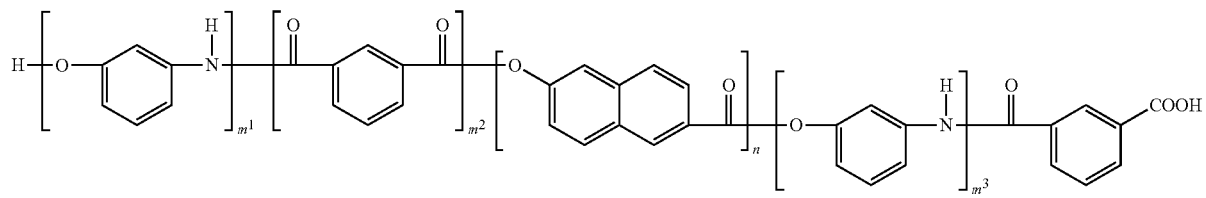

-continued

Chemical Formula 17d

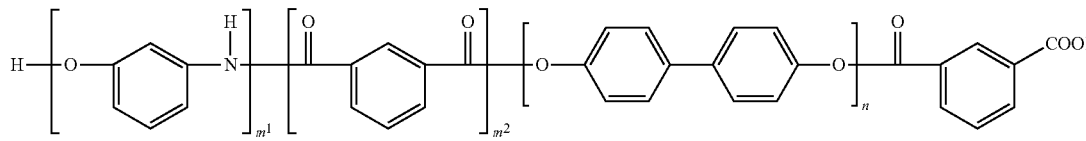

Chemical Formula 17e

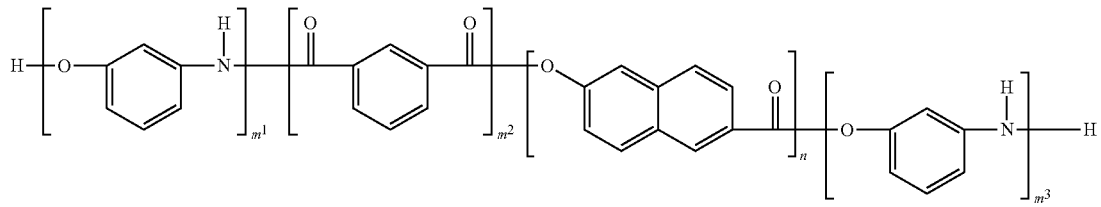

wherein, in the above Chemical Formulae, m, n, $m^1$, $m^2$, $m^3$, $n^1$, $n^2$, $n^3$, and $n^4$ are integers of from 1 to 100, in Chemical Formulae 13a, 13b, 13d, 14a, 14b, 14d, 15a, 15b, 15d, 16a, 16b, and 16d, $1 \le n^1+n^2+n^3+n^4 \le 100$, in Chemical Formulae 13c, 13e, 14c, 14e, 15c, 15e, 16c, and 16e, $1 \le n^1+n^2 \le 100$, in Chemical Formulae 17a, 17c, and 17e, $1 \le m^1+m^2+m^3 \le 100$, and in Chemical Formulae 17b and 17d, $1 \le m^1+m^2+m^3 \le 100$.

9. The thermosetting composition of claim 1, wherein the liquid crystal oligomer further independently comprises maleimide, nadimide, citraconimide, tetrahydrophthalimide, acetylene, propargyl ether, benzocyclobutene, cyanate, a substituent thereof, a derivative thereof, or a combination comprising at least one of the foregoing at each terminal end or on a side chain.

10. The thermosetting composition of claim 9, wherein the liquid crystal oligomer comprises one selected from the compound represented by Chemical Formulae 18a to 18k:

Chemical Formula 18a

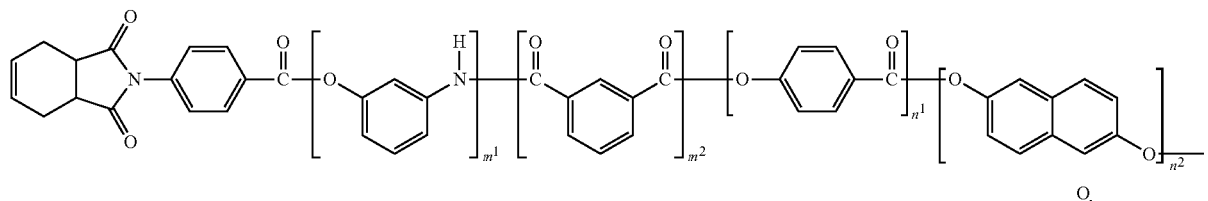

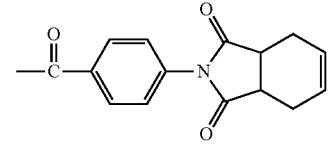

Chemical Formula 18b

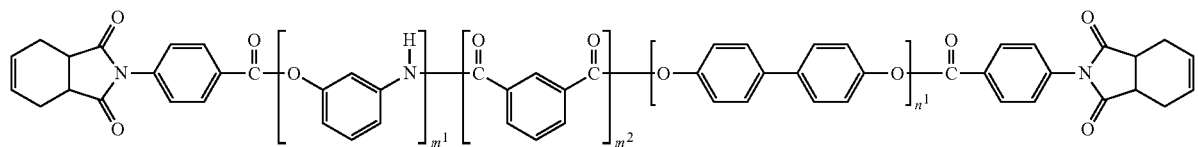

Chemical Formula 18c

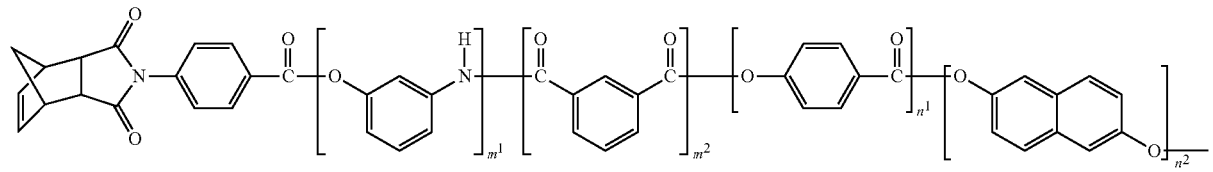

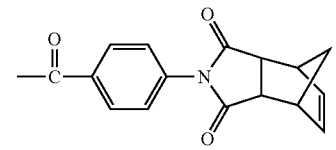

-continued
Chemical Formula 18d
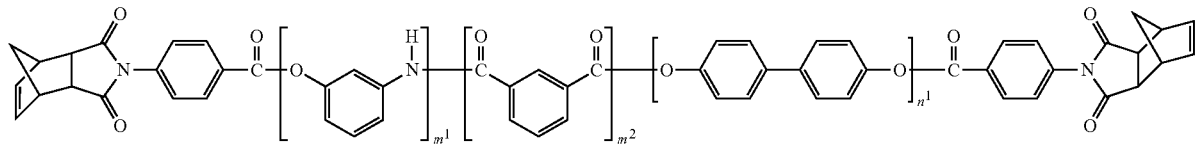
Chemical Formula 18e
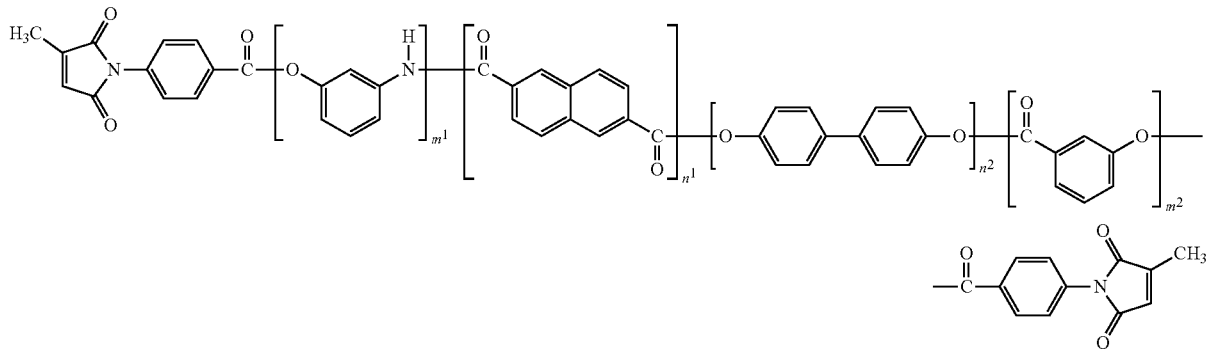
Chemical Formula 18f
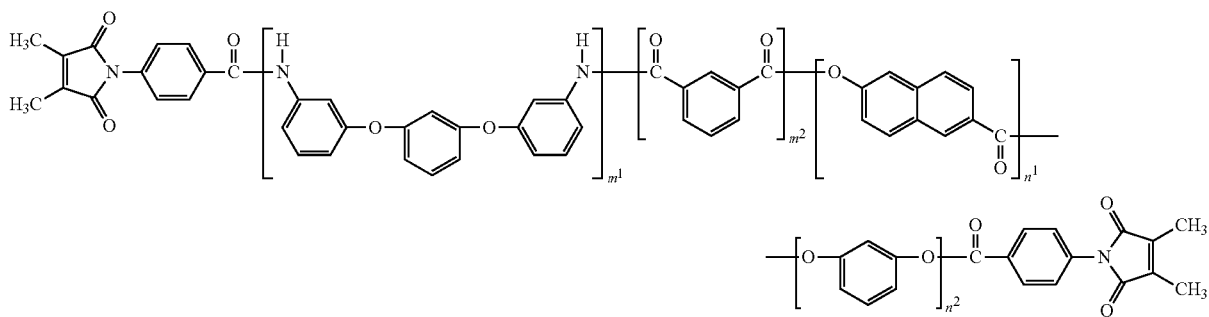
Chemical Formula 18g
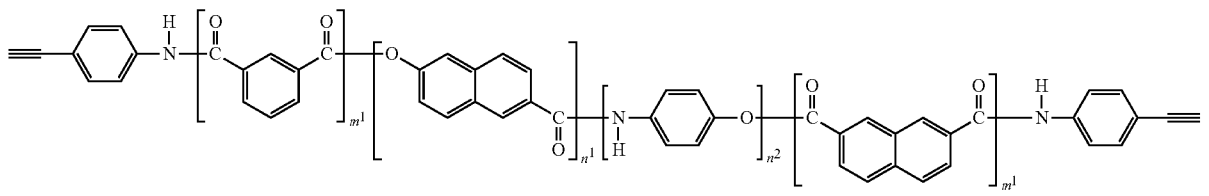
Chemical Formula 18h
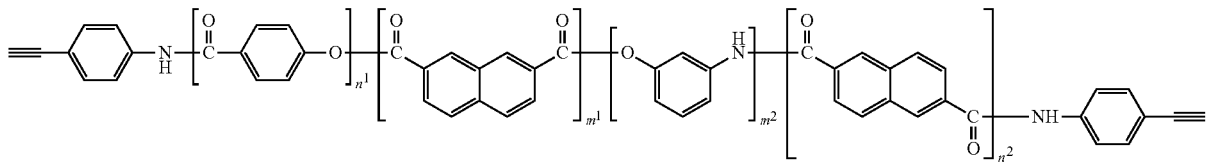
Chemical Formula 18i
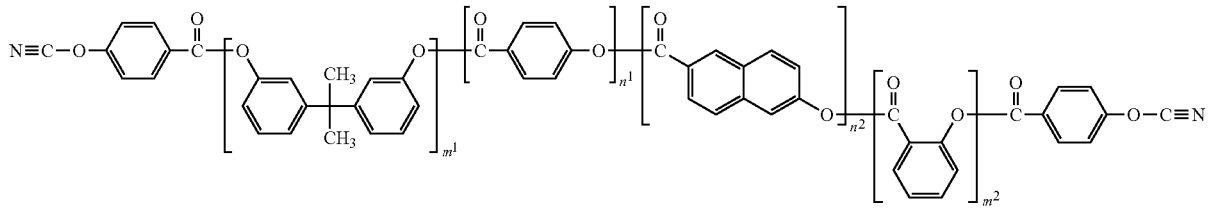

-continued

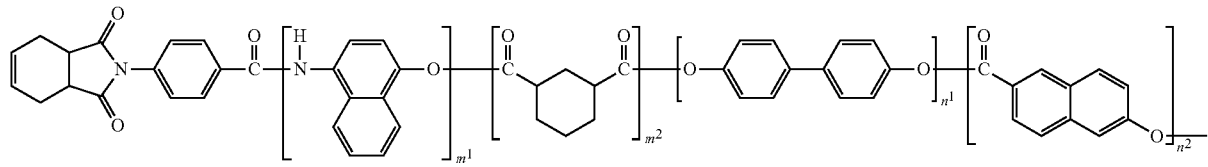
Chemical Formula 18j

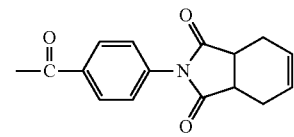
Chemical Formula 18k

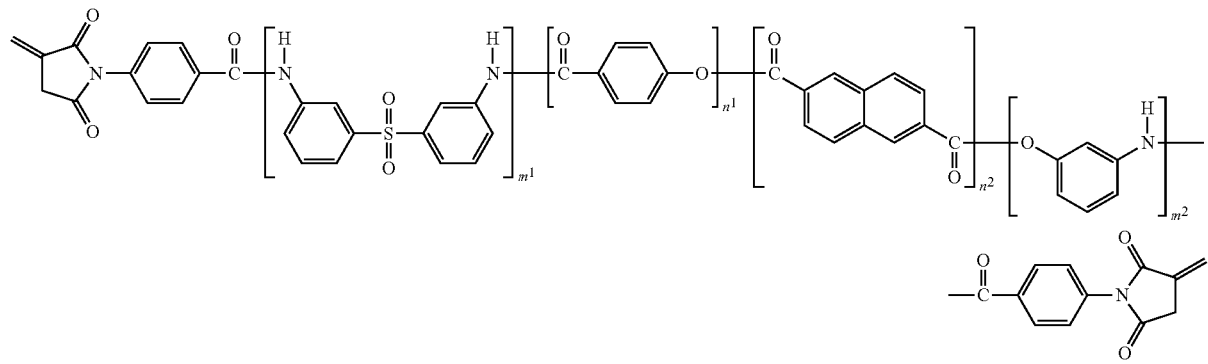

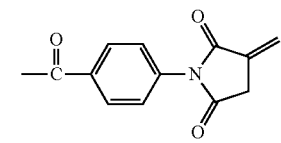

wherein, in Chemical Formulae 18a to 18k, $m^1$, $m^2$, $n^1$, and $n^2$ are independently integers of from 1 to 50.

11. The thermosetting composition of claim 1, wherein the liquid crystal oligomer has a number average molecular weight of from about 500 to about 9,000.

12. The thermosetting composition of claim 1, wherein the bismaleimide-based cross-linking agent comprises a bismaleimide-based compound represented by the following Chemical Formula 19:

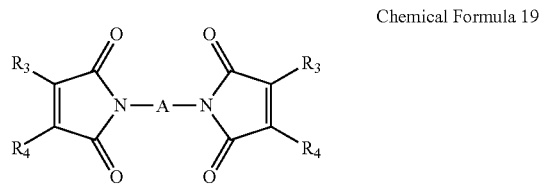
Chemical Formula 19 wherein, in the above Chemical Formula 19, $R_3$ and $R_4$ are independently H or $CH_3$, and A is at least one of a structural unit selected from a divalent linker including a C2 to C18 alkylene group or an aromatic group, a linker represented by the following Chemical Formula 19a, or a combination comprising at least one of the foregoing:

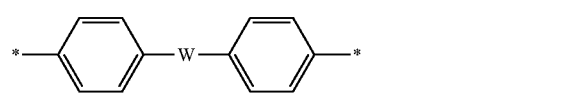
Chemical Formula 19a wherein, in the above Chemical Formula 19a, W is O, S, C(=O), S(=O), $SO_2$, a linear or branched C1 to C20 alkyl group, a substituted or unsubstituted C2 to C20 alkylene group, a substituted or unsubstituted C2 to C20 alkoxylene group, a substituted or unsubstituted C2 to C20 alkoxyleneoxy group, a substituted or unsubstituted C6 to C30 arylene group, a substituted or unsubstituted C6 to C30 aryleneoxy group, a substituted or unsubstituted C6 to C30 heteroarylene group, a substituted or unsubstituted C6 to C30 heteroaryleneoxy group, a linker represented by the following Chemical Formula 19b, or a combination comprising at least one of the foregoing:

Chemical Formula 19b wherein, in the above Chemical Formula 19b, $Z_1$ and $Z_2$ are independently, O, S, C(=O), S(=O), $SO_2$, C(=O)NH, or C(=O)O, and $Ar^5$ is selected from linkers represented by any of the following Chemical Formulae 19c-1 19c-6:

Chemical Formula 19c-1

Chemical Formula 19c-2

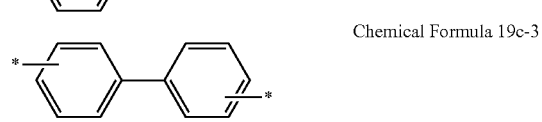
Chemical Formula 19c-3

-continued

Chemical Formula 19c-4

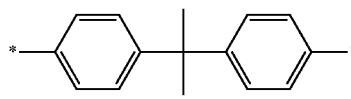

Chemical Formula 19c-5

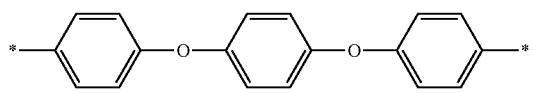

Chemical Formula 19c-6

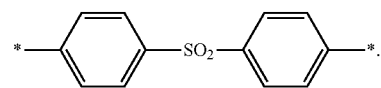

13. The thermosetting composition of claim 1, wherein the bismaleimide-based compound comprises one selected from the compounds represented by the following Chemical Formulae 20a to 20r:

Chemical Formula 20a

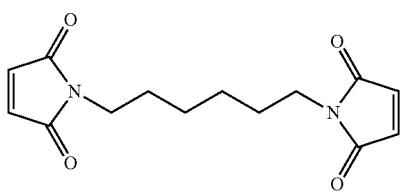

Chemical Formula 20b

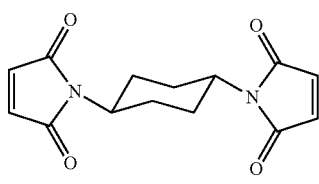

Chemical Formula 20c

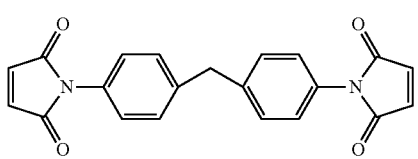

Chemical Formula 20d

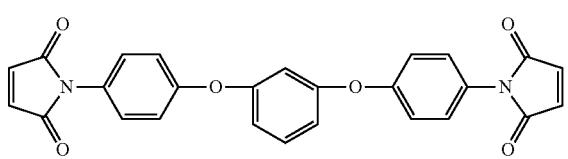

Chemical Formula 20e

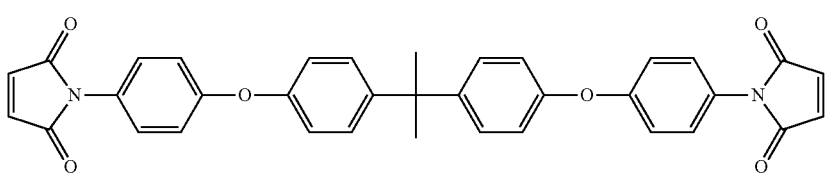

Chemical Formula 20f

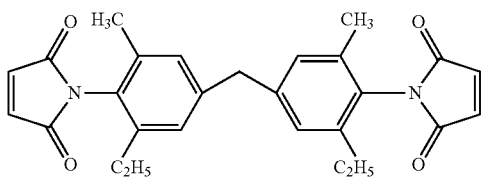

Chemical Formula 20g

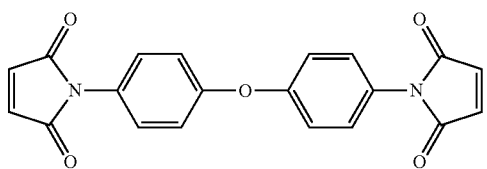

Chemical Formula 20h

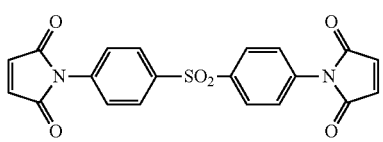

Chemical Formula 20i

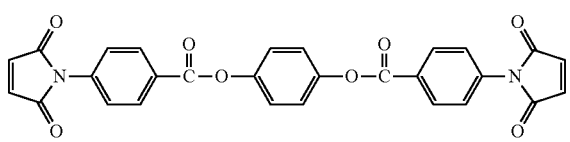

Chemical Formula 20j

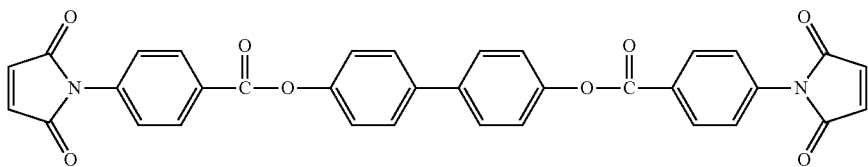

Chemical Formula 20k

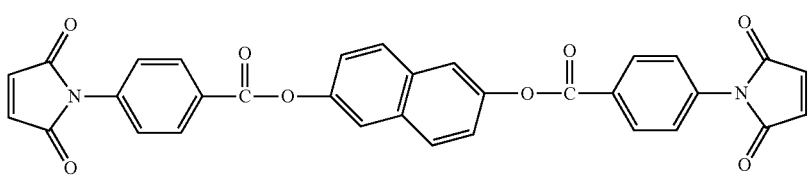

Chemical Formula 20l
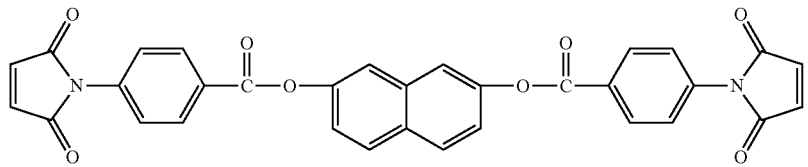

Chemical Formula 20m
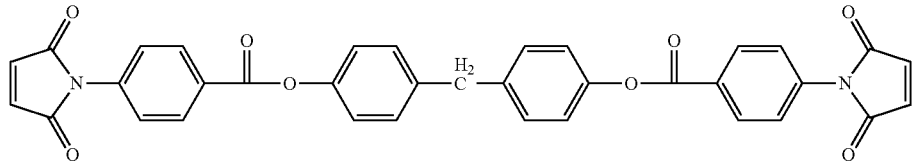

Chemical Formula 20n
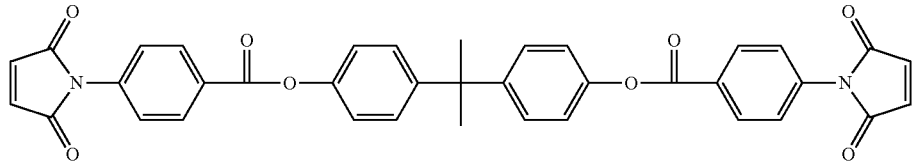

Chemical Formula 20o
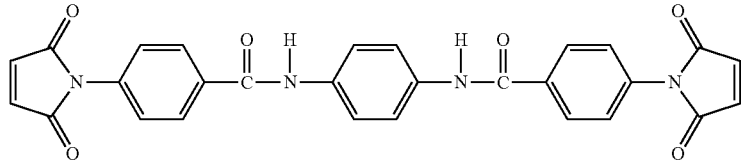

Chemical Formula 20p
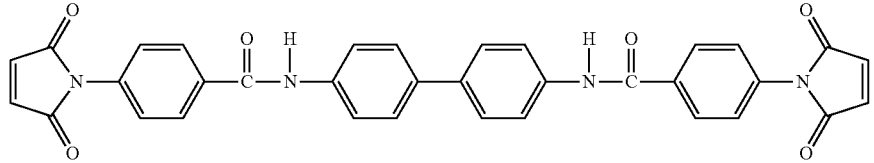

Chemical Formula 20q
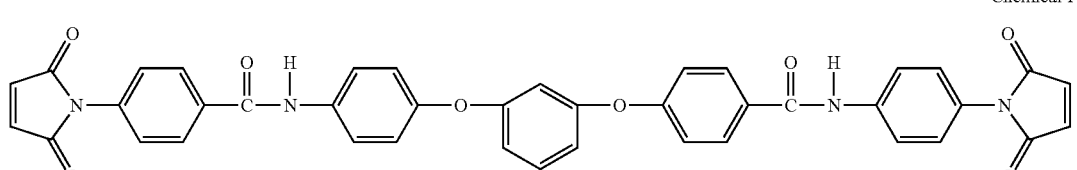

Chemical Formula 20r
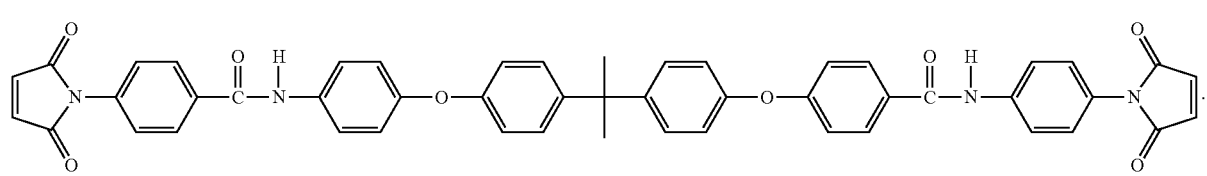

14. The thermosetting composition of claim 1, wherein the fluorinated polymer resin powder comprises a fluorinated resin or a fluorinated resin copolymer.

15. The thermosetting composition of claim 1, wherein the fluorinated resin powder has an average particle diameter of from about 0.02 μm to 500 μm.

16. The thermosetting composition of claim 1, wherein the fluorine-based polymer resin powder comprises poly(tetrafluoroethylene, poly(ethylene-co-tetrafluoroethylene), poly(ethylene-co-chlorotrifluoroethylene), poly(vinylidene fluoride), poly(vinylidene fluoride-co-hexafluoropropylene), poly(tetrafluoroethylene-co-hexafluoropropylene), polychlorotrifluoroethylene, or a combination comprising at least one of the foregoing.

17. The thermosetting composition of claim 1, wherein the thermosetting composition comprises about 5 parts by weight to about 95 parts by weight of the liquid crystal oligomer, about 5 to about 100 parts by weight of the bismaleimide-based compound, and about 5 to about 100 parts by weight of the epoxy compound based on 100 parts by weight of the organic solvent.

18. A resin cured product comprising a cross-linked product of the thermosetting composition according to claim 1.

19. A board comprising a resin cured product according to claim 18.

20. The board of claim 19, wherein the resin cured product further comprises a reinforcing material, wherein the resin cured product is invaded into the reinforcing material and attached thereto, or disposed on the surface of the reinforcing material surface.

21. The board of claim 19, wherein the board further comprises a metal foil bonded to at least one side of the resin cured product.

22. The board of claim 21, wherein the metal foil bonded to at least one side of the resin cured product is patterned.

23. A storage medium comprising the board according to claim 19; and a memory chip electrically connected to the board.

24. The thermosetting composition of claim 1, wherein the epoxy compound includes two or more of a structure represented by Chemical Formula 21:

Chemical Formula 21

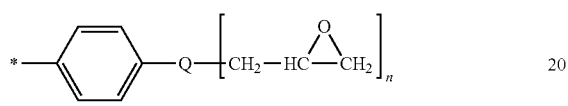

wherein, in Chemical Formula 21, Q is O, S, $P(R)_3$, or NR, provided that when Q is O or S, n is 1, and when Q is $P(R)_3$ or NR, n is 1 or 2, and wherein R is hydrogen or a C1 to C20 alkyl group.

\* \* \* \* \*